(12) United States Patent
Chen et al.

(10) Patent No.: US 7,263,477 B2
(45) Date of Patent: Aug. 28, 2007

(54) METHOD AND APPARATUS FOR MODELING DEVICES HAVING DIFFERENT GEOMETRIES

(75) Inventors: Ping Chen, San Jose, CA (US); Zhihong Liu, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 685 days.

(21) Appl. No.: 10/457,945

(22) Filed: Jun. 9, 2003

(65) Prior Publication Data

US 2005/0027501 A1   Feb. 3, 2005

(51) Int. Cl.
*G06F 17/50* (2006.01)
(52) U.S. Cl. .............................. 703/13; 703/14; 703/2; 703/15; 716/1; 716/4; 700/31
(58) Field of Classification Search .................. 703/2, 703/14, 15; 716/1, 4; 700/31
See application file for complete search history.

(56) References Cited

U.S. PATENT DOCUMENTS

| | | | |
|---|---|---|---|
| 5,825,673 A * | 10/1998 | Watanabe | 703/14 |
| 6,577,992 B1 * | 6/2003 | Tcherniaev et al. | 703/14 |
| 6,795,800 B1 * | 9/2004 | Lee | 703/2 |
| 2002/0035462 A1 * | 3/2002 | Kidera et al. | 703/14 |
| 2002/0123872 A1 * | 9/2002 | Okada | 703/15 |
| 2002/0133785 A1 * | 9/2002 | Kondo | 716/1 |
| 2002/0193892 A1 * | 12/2002 | Bertsch et al. | 700/31 |
| 2003/0065494 A1 * | 4/2003 | Croix | 703/2 |
| 2003/0163295 A1 * | 8/2003 | Jakatdar et al. | 703/14 |
| 2003/0182639 A1 * | 9/2003 | Lehner et al. | 716/4 |
| 2004/0002844 A1 * | 1/2004 | Jess et al. | 703/14 |
| 2004/0044510 A1 * | 3/2004 | Zolotov et al. | 703/14 |
| 2004/0064296 A1 * | 4/2004 | Saxena et al. | 703/2 |

OTHER PUBLICATIONS

Jiang et al., "MOSFET Parameter extraction in VDSM ULSI CAD with a parallel programming strategy", IEEE 2001.*
Ferreira et al., "LASCA-Interconnect parasitic extraction tool for deep-submicron IC Design", IEEE 2000.*
Chinnery et al., "Achievinf 550 MHz in an ASIC Methodology", ACM 2001.*

(Continued)

*Primary Examiner*—Paul Rodriguez
*Assistant Examiner*—K. Thangavelu
(74) *Attorney, Agent, or Firm*—Robert E. Scheid; Novak Druce & Quigg LLP

(57) ABSTRACT

The present invention includes a method for modeling devices having different geometries, in which a range of interest for device geometrical variations is divided into a plurality of subregions each corresponding to a subrange of device geometrical variations. The plurality of subregions include a first type of subregions and a second type of subregions. The first or second type of subregions include one or more subregions. A regional global model is generated for each of the first type of subregions and a binning model is generated for each of the second type of subregions. The regional global model for a subregion uses one set of model parameters to comprehend the subrange of device geometrical variations corresponding to the G-type subregion. The binning model for a subregion includes binning parameters to provide continuity of the model parameters when device geometry varies across two different subregions.

22 Claims, 18 Drawing Sheets

OTHER PUBLICATIONS

Manne at al., "Computing the Maximum Power cycles of a sequential circuit", ACM 1995.*

Cheng et al., "A physical and scalable I-V model in BSIMv3 for analog/digital circuit simulation", IEEE 1997.*

Hsu et al., "Study of extraction analysis of BSIM4 model parameters on MOSFET device", Dept. of Electrical Engineering, Feng Cha University, Taiwan 1998.*

Yuhua Cheng et al. "MOSFET Modeling & BSIM3 User's Guide", by Kluwer Academic Publishers, (Index and Contents) 1999.

John G. J. Chern et al., "A New Method to Determine MOSFET Channel Length", IEEE Electron Device Letters, vol. EDL.-1, No. 9, Sep. 1980, pp. 170-173.

Hassan Rofigul et al., "Drain and Source Resistances of Short-Channel LDD MOSFETS", Solid State Electronics vol. 41, No. 5, pp. 778-780, 1997.

Daniel P. Foty, "MOSFET Modeling With Spice Principles and Practice", by Prentice Hall PTR, (Contents and Index), 1997.

Weidong Liu et al., "BSIM3.2.2. MOSFET Model—User's Manual", Department of El. Engineering and Computer Sciences UC Berkeley, (Table of Contents), 1999.

Weidong Liu et al., "BSIM4.0.0 MOSFET Model—User's Manual", Department of El. Engineering and Computer Sciences UC Berkeley, (Table of Contents), 2000.

Kazuo Terada et al., "A New Method to Determine Effective MOSFET Channel Length", Japanese J. of Applied Physics, vol. 18, No. 5, May 1979, pp. 953-959.

BSIMPro™ "SPICE Model Parameter Extraction", BTA Technology, title pg., pp. 1-9, last pg., 1999.

BSIMPro+ Device Modeling Guide Version 2001.3 by Celestry Design Technologies, Inc., published Sep. 2001.

* cited by examiner

| Model's General Information 410 | Parameter Definition 420 | Operation Point Definition 430 |

FIGURE 4

METHOD AND APPARATUS FOR MODELING DEVICES HAVING DIFFERENT GEOMETRIES

BACKGROUND OF THE INVENTION

1. Field of the Invention

The invention relates generally to computer-aided electronic circuit simulation, and more particularly, to a method of extracting semiconductor device model parameters for use in integrated circuit simulation.

2. Description of Related Art

While the sizes of individual devices have decreased, the complexities of integrated circuits have increased at a dramatic rate over the past few decades. As circuits have become more complex, traditional breadboard methods have become burdensome and overly complicated. Modern circuit designers rely more and more on computer aids, and electronic circuit simulators have become indispensable tools for circuit design. Examples of electronic circuit simulators include the Simulation Program with Integrated Circuit Emphasis (SPICE) developed at the University of California, Berkeley (UC Berkeley), and various enhanced versions or derivatives of SPICE, such as, SPICE2 or SPICE3, also developed at UC Berkeley; HSPICE, developed by Meta-software and now owned by Avant!; PSPICE, developed by Micro-Sim; and SPECTRE, developed by Cadence, ELDO developed by Mentor Graphics, SSPICE developed by Silvaco, and the like. In addition, many semiconductor companies use their proprietary versions of SPICE circuit simulators. SPICE and its various versions or derivatives will be referred to hereafter as SPICE circuit simulators.

An electronic circuit may contain a variety of circuit elements such as resistors, capacitors, inductors, mutual inductors, transmission lines, diodes, bipolar junction transistors (BJT), junction field effect transistors (JFET), and metal-on-silicon field effect transistors (MOSFET), etc. A SPICE circuit simulator makes use of built-in or plug-in models for the circuit elements, especially semiconductor device elements (or device) such as diodes, BJTs, JFETs, and MOSFETs.

A model for a device mathematically represents the device characteristics under various bias conditions. For example, for a MOSFET device model, in DC and AC analysis, the inputs of the device model are the drain-to-source, gate-to-source, bulk-to-source voltages, and the device temperature. The outputs are the various terminal currents. A device model typically includes model equations and a set of model parameters. The set of model parameters for a semiconductor device is often referred as a model card (or, in abbreviation, a "model") for the device. Together with the model equations, the model card directly affects the final outcome of the terminal currents and is used to emulate the behavior of the semiconductor device in an integrated circuit. In order to represent actual device performance, a successful device model is tied to the actual fabrication process used to manufacture the device represented. This connection is also represented by the model card, which is dependent on the fabrication process used to manufacture the device.

In modern device models, such as BSIM (Berkeley Short-Channel IGFET Model) and its derivatives, BSIM3, BSIM4, and BSIMPD (Berkeley Short-Channel IGFET Model Partial Depletion), all developed at UC Berkeley, only a few of the model parameters in a model card can be directly measured from actual devices. The rest of the model parameters are extracted using nonlinear equations with complex extraction methods. See Daniel Foty, "MOSFET Modeling with Spice—Principles and Practice," Prentice Hall PTR, 1997.

Since simulation algorithms and convergence techniques in circuit simulators have become mature, the accuracy of SPICE simulation is mainly determined by the accuracy of the device models. As a result, there is a strong need for accurate device models to predict circuit performance. Traditionally, in an integrated circuit design, only MOSFETs having a single drawn channel length are utilized so that a single MOSFET model card, which is accurate for a single drawn channel length, would be sufficient. In modern integrated circuit design, however, it is not uncommon to include in an integrated circuit MOSFETs having different geometries, i.e., different drawn channel lengths and drawn channel widths. In addition to describing a set of devices with different geometries, a device model should also satisfy criteria outside the device's allowed operating regime to ensure robust convergence properties during circuit simulation. Furthermore, it is desirable that the device model should include the effect of device size fluctuations and technology modifications so that it can be used by circuit designers to study the statistical behavior of the circuits, and to explore circuit design for a modified or more advanced technology.

Before scalable models were developed, binning was used to expand the single device model cards to comprehend a broader range of device geometrical variations. When modeling MOSFET devices using binning, a geometrical space constituted by ranges of interest for the channel length and width is divided into smaller regions or bins, and a different binning model card is created for each of these bins. Although the binning model cards, when properly created, can accurately model device behavior in a broad range of device sizes, it is less scalable and involves many additional parameters that have no physical meanings. Also, to obtain the binning model cards with good accuracy, test results from many differently sized devices are required. Most importantly, since each binning model is created for its own bin in isolation from the creation of the binning models for the other bins, binning can result in discontinuity in device characteristics as the device geometry is varied across the boundaries of adjacent bins. This discontinuity can complicate statistical analysis of device and circuit behavior and cause convergence problem during circuit simulation.

To overcome the problems of binning, scalable device models are developed. A scalable device model, such as BSIM3, BSIM4, BSIMPD, includes model equations that comprehend a wide range of device geometrical variations and it allows the use of one set of model parameters (or a single global model card) to model devices over the range of geometrical variations. A scalable model is generally a physical model because many of its model equations are based on device physics. The global model card thus has better scalability than the binning model cards and there is no concern about discontinuity. The modeling accuracy, however, is sometimes not satisfactory, especially when it is used to comprehend relatively large devices as well as deep-submicron devices (e.g., devices with drawn channel length less than 0.1 μm or drawn channel width less than 0.13 μm), due to the complicated process and device physics associated with these smaller geometries.

SUMMARY OF THE INVENTION

The present invention includes a new method for modeling devices having different geometries. In one embodiment of the present invention, the geometries of the devices to be modeled are in a geometrical space representing a range of channel lengths and channel widths, and the geometrical space is divided into a plurality of subregions each corresponding to a subrange of device geometrical variations. The plurality of subregions include a first set of subregions and a second set of subregions. The first or second set of subregions include one or more subregions. A regional global model is generated for each of the first set of subregions based on model equations and measurement data taken from a plurality of test devices. A binning model is generated for each of the second set of subregions based on model parameters extracted for one or more subregions in the first set of subregions. The regional global model for a subregion uses one set of model parameters to comprehend the subrange of device geometrical variations corresponding to the subregion. The binning model for a subregion includes binning parameters to provide continuity of the model parameters when device geometry varies across two different subregions.

The present invention also includes a computer readable medium comprising computer executable program instructions that when executed cause a digital processing system to perform a method for extracting semiconductor device model parameters. The method includes the steps of dividing a geometrical space including the different geometries into a first set of subregions and a second set of subregions, the first or the second set of subregions including one or more subregions; extracting a set of model parameters for each of the first set of subregions using model equations associated with the device model and measurement data obtained from a plurality of test devices; and determining binning parameters for each of the second set of subregions using one or more model parameters associated with one or more subregions in the first set of subregions.

BRIEF DESCRIPTION OF THE DRAWINGS

FIG. 4 is a block diagram of a model definition input file in accordance with an embodiment of the present invention;

DETAILED DESCRIPTION OF THE INVENTION

Figure 1:
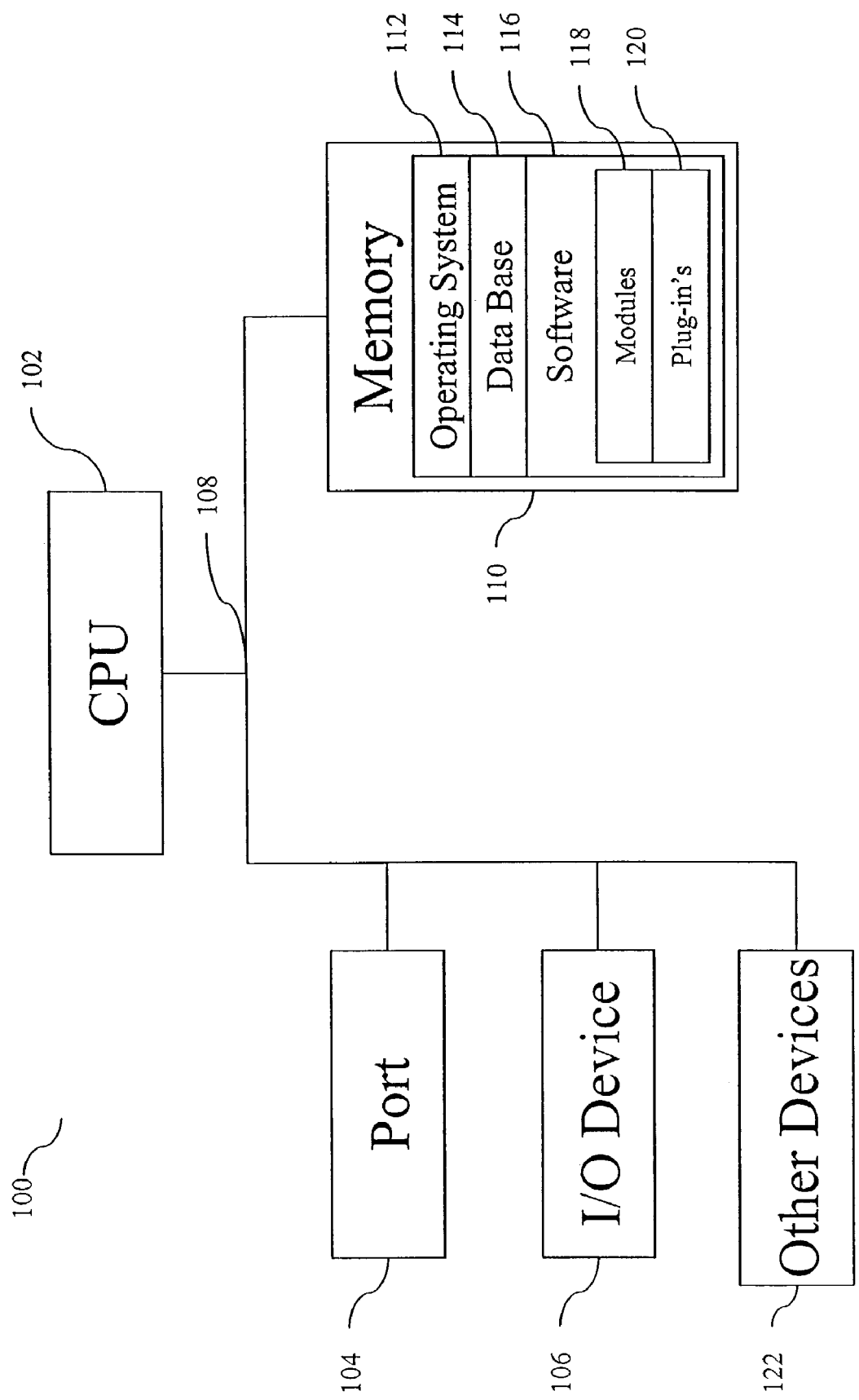
FIG. 1 is a block diagram of a system according to an embodiment of the present invention.

As shown in FIG. 1, system 100, according to one embodiment of the present invention, comprises a central processing unit (CPU) 102, which includes a RAM, and a disk memory 110 coupled to the CPU 102 through a bus 108. The system 100 further comprises a set of input/output (I/O) devices 106, such as a keypad, a mouse, and a display device, also coupled to the CPU 102 through the bus 108. The system 100 may further include an input port 104 for receiving data from a measurement device (not shown), as explained in more detail below. The system 100 may also include other devices 122. An example of system 100 is a Pentium 133 PC/Compatible computer having RAM larger than 64 MB and a hard disk larger than 1 GB.

Memory 110 has computer readable memory spaces such as database 114 that stores data, memory space 112 that stores operating system 112 such as Windows 95/98/NT4.0/2000, which has instructions for communicating, processing, accessing, storing and searching data, and memory space 116 that stores program instructions (software) for carrying out the method of according to one embodiment of the present invention. Memory space 116 may be further subdivided as appropriate, for example to include memory portions 118 and 120 for storing modules and plug-in models, respectively, of the software.

Figure 2A:
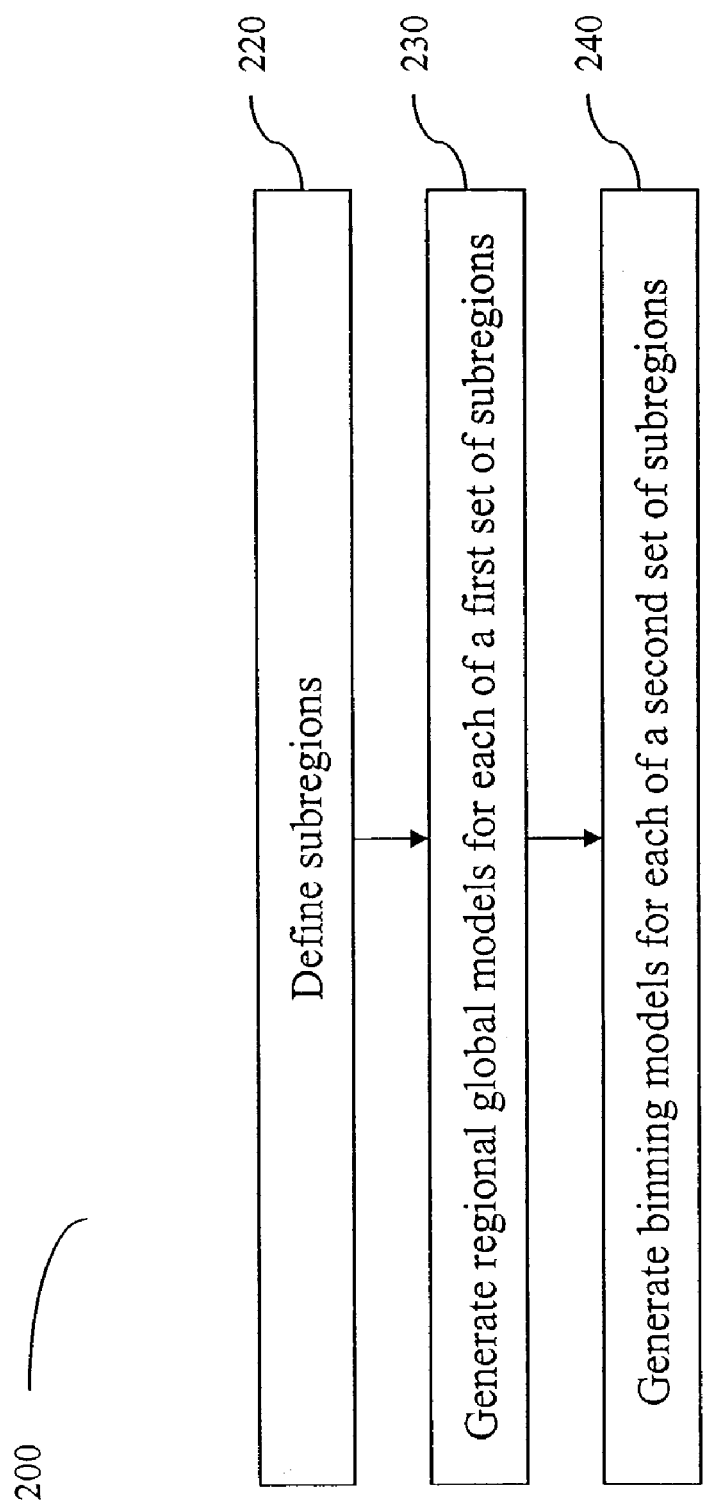
FIG. 2A is a flowchart illustrating a method for modeling devices with various geometries in accordance with an embodiment of the present invention.

A process 200 for modeling devices with various geometries, as shown in FIG. 2A, includes step 220 in which a device geometry space is divided into a plurality of subregions. A first subset of the plurality of subregions include one or more G-type subregions, i.e., subregions for regional global model generation, and a second subset of the plurality of subregions include one or more B-type subregions, i.e., subregions for binning model generation. Process 200 further includes step 230 in which a regional global model is generated for each of the G-type subregions and step 240 in which a binning model is generated for each of the B-type subregions.

Figure 3A:
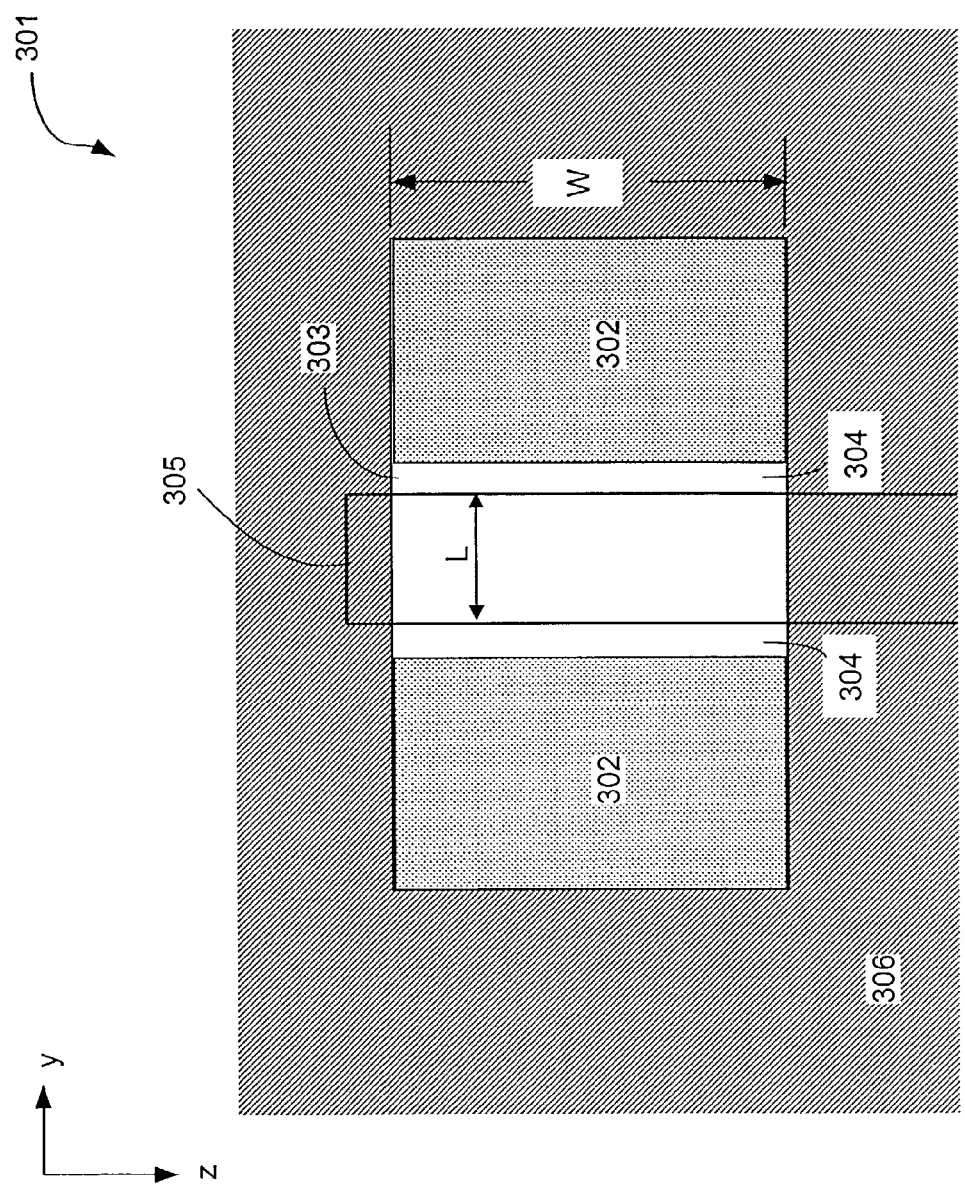
FIG. 3A is a block diagram illustrating a top view of a typical MOSFET device.

To illustrate the device geometry, a illustrative layout of a MOSFET device is shown in FIG. 3A. Referring to FIG. 3A, the MOSFET device 301 includes a gate 305, and source/drain diffusion regions 302 on two sides of the gate 305 in an active region 303. Active region 303 may be bordered on some or all sides by isolation (or field) regions 306, which separate MOSFET 301 from other devices in an IC. The extent of gate 305 as drawn in the layout along the y-direction shown in FIG. 3A is called the drawn channel length (or channel length) L of the MOSFET device 301, while the extent of source/drain diffusion regions 302 as drawn in the layout along the z direction is called the drawn channel width (or channel width) W of the MOSFET device 301.

Figure 3B:
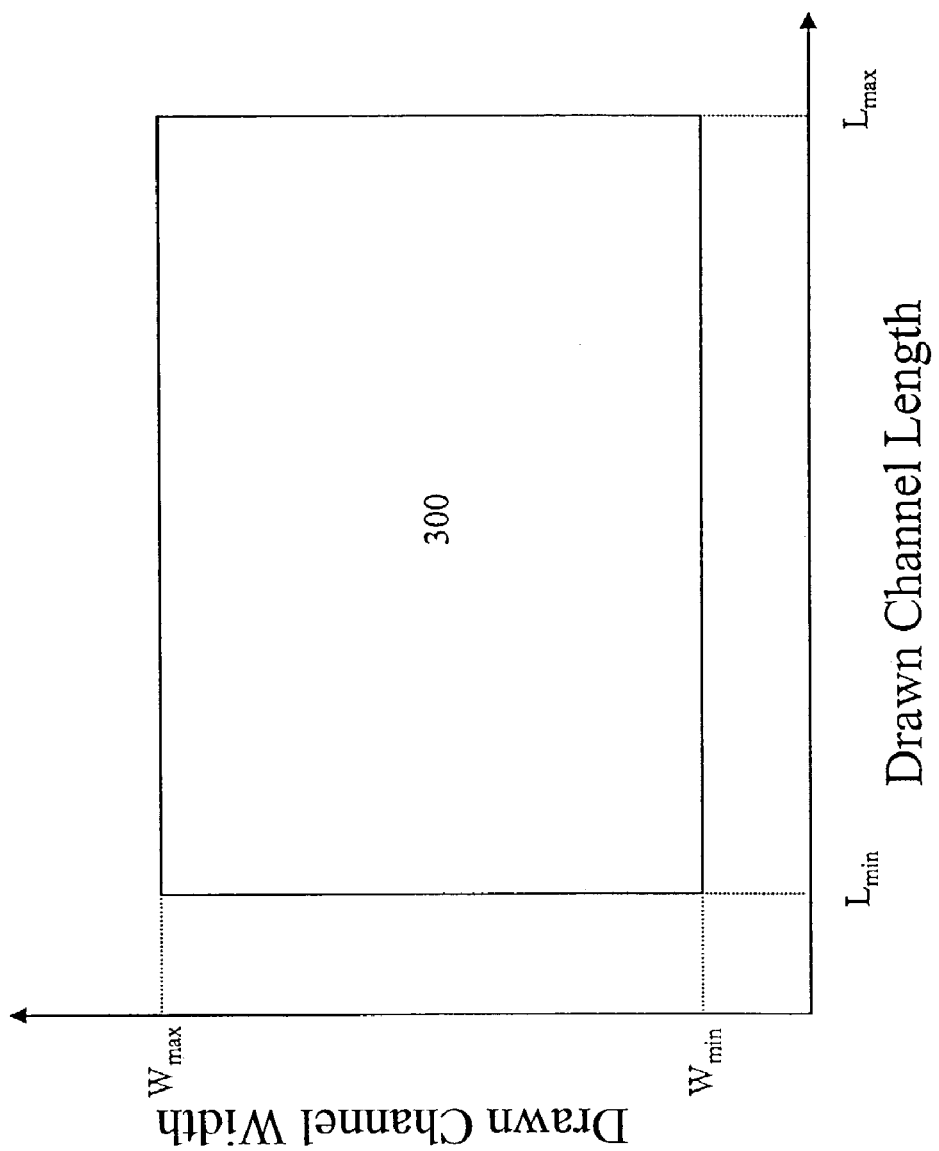
FIG. 3B is a chart illustrating a device geometrical space.
Figure 3C:
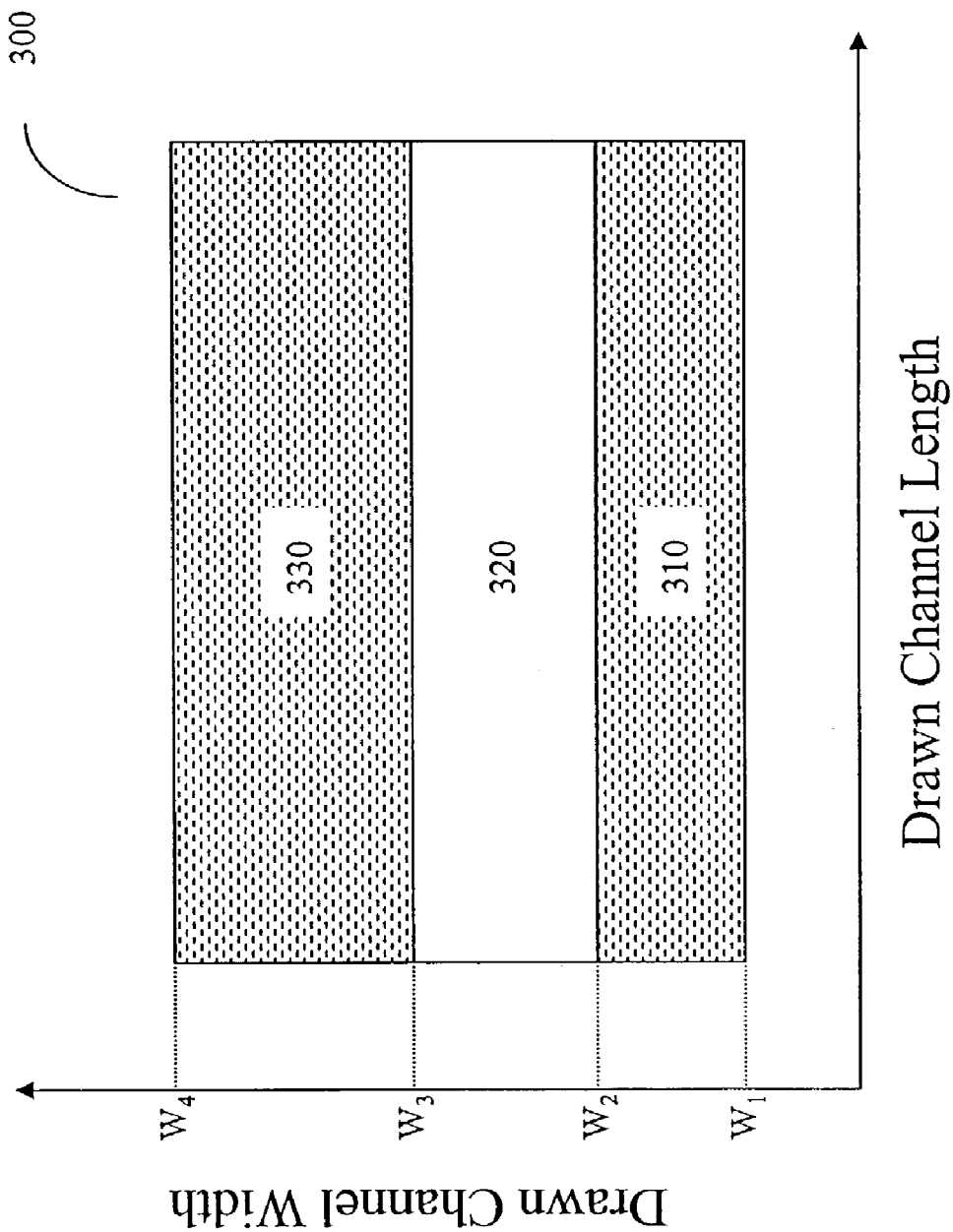
FIG. 3C is a chart illustrating definition of subregions in a device geometrical space according to one embodiment of the present invention.

A device geometrical space can be used to represent a range of interest for the MOSFET device geometrical variations. FIG. 3B illustrates a geometrical space 300 corresponding to channel length variations ranging from $L_{min}$ to $L_{max}$ and channel width variations ranging from $W_{min}$ to $W_{max}$. FIG. 3C illustrates an example of dividing the device geometrical space 300 in step 220 of process 200. As shown in FIG. 3C, the geometrical space 300 for a MOSFET device is divided into a pluality of subregions such as subregions 310, 320, and 330, among which subregions 310 and 330 are G-type subregions, and subregion 320 is a B-type subregion. The G-type subregions 310 and 330 are separated by the B-type subregion 320. As shown in FIG. 3C, the range of channel width variations in the geometrical space 300 spans from $W_{min}$ to $W_{max}$, and subregion 310 covers a drawn channel width subrange of $W_1=W_{min}$ to $W_2$, subregion 320 covers a drawn channel width subrange of $W_2$ to $W_3$, and subregion 330 covers a drawn channel width subrange of $W_3$ to $W_4=W_{max}$. In the example shown in FIG. 3C, the divisions of the subregions are made along the drawn channel length axis so that each subregion emcompass all of the channel length variations in the geometrical space 300 and a subrange of the channel width variations. The subregions are divided in the way because many MOSFET device models scale better for channel length variations than for channel width variations. FIG. 3C, however, only shows one way of dividing the geometrical space 300. Different ways of dividing the geometry space can be used for different applications without departing from the scope of the present invention.

Figure 3D:
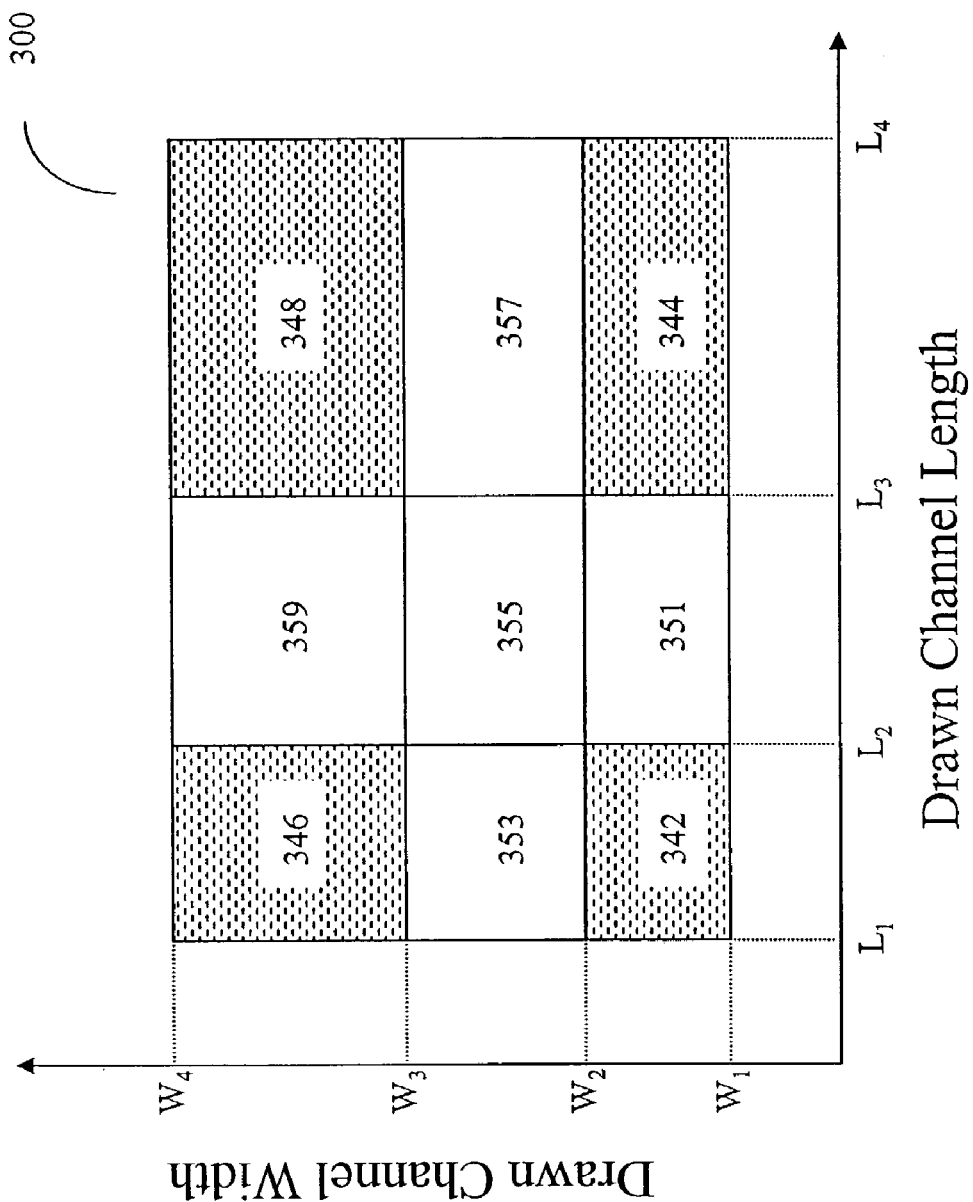
FIG. 3D is a chart illustrating definition of subregions in a device geometrical space according to an alternative embodiment of the present invention.

For example, FIG. 3D illustrates another example of dividing the geometrical space 300 according to an alternative embodiment of the present invention. As shown in FIG. 3D, the geometrical space 300 is divided into nine subregions including four G-type subregion 342, 344, 346, and 348, and five B-type subregions 351, 353, 355, 357, and 359. Subregion 342 covers a drawn channel width subrange of $W_1=W_{min}$ to $W_2$ and a drawn channel length subrange of $L_1=L_{min}$ to $L_2$, subregion 344 covers a drawn channel width subrange of $W_1$ to $W_2$ and a drawn channel length subrange of $L_3$ to $L_4=L_{max}$, subregion 346 covers a drawn channel width subrange of $W_3$ to $W_4=W_{max}$ and a drawn channel length subrange of $L_1$ to $L_2$, and subregion 348 covers a drawn channel width subrange of $W_3$ to $W_4$ and a drawn channel length subrange of $L_3$ to $L_4$. Also subregion 351 covers a drawn channel width subrange of $W_1$ to $W_2$ and a drawn channel length subrange of $L_2$ to $L_3$, subregion 353 covers a drawn channel width subrange of $W_2$ to $W_3$ and a drawn channel length subrange of $L_1$ to $L_2$, subregion 355 covers a drawn channel width subrange of $W_2$ to $W_3$ and a drawn channel length subrange of $L_2$ to $L_3$, subregion 357 covers a drawn channel width subrange of $W_2$ to $W_3$ and a drawn channel length subrange of $L_3$ to $L_4$, and subregion 359 covers a drawn channel width subrange of $W_3$ to $W_4$ and a drawn channel length subrange of $L_2$ to $L_3$.

Figure 2B:
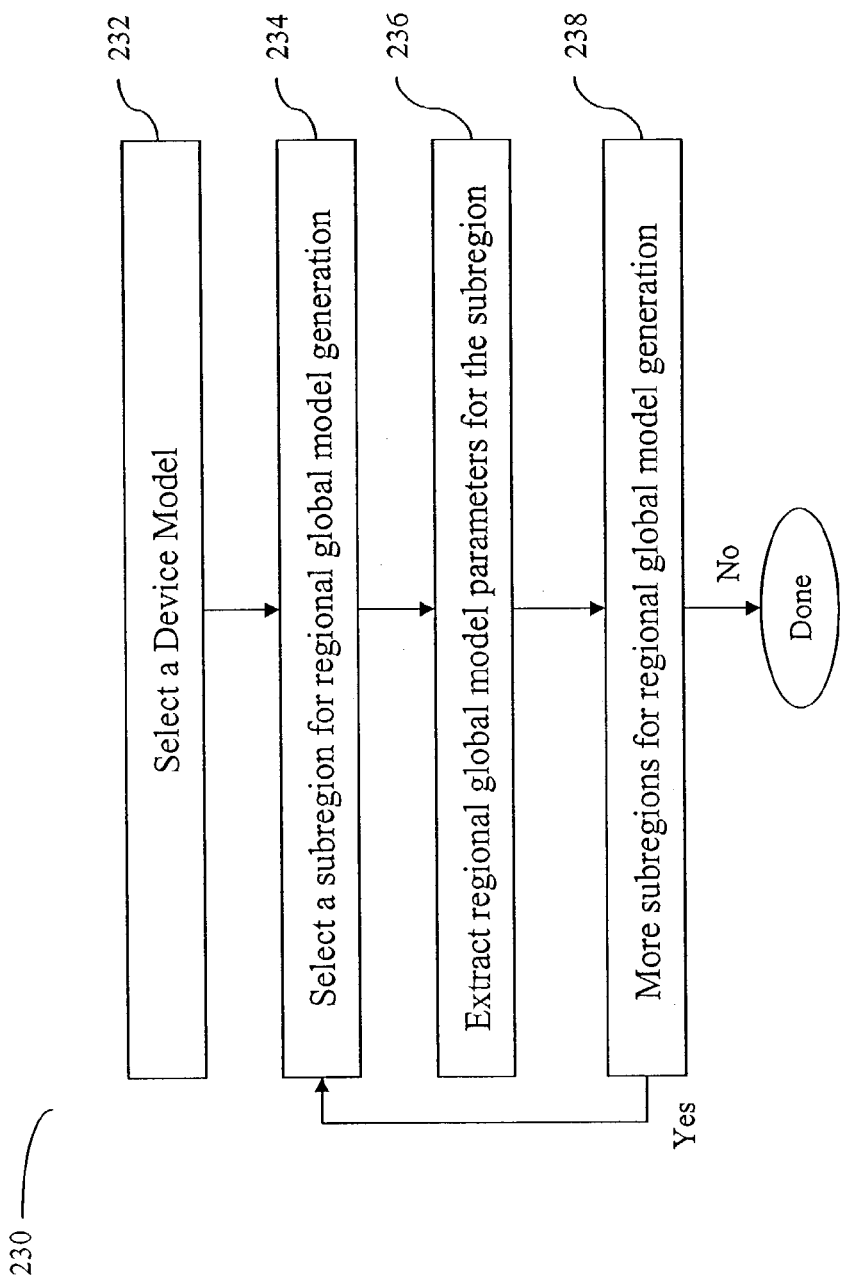
FIG. 2B is a flowchart illustrating a method for generating regional global models according to one embodiment of the present invention.

FIG. 2B illustrates in further detail the regional global model generation step 230 in process 200. As shown in FIG. 2B, step 230 includes substep 232, in which the device model for modeling the devices is selected. When system 100 is used to carry out process 200, the model may be stored in the database 114 as a model definition file, and substep 232 includes loading the model definition file from database 114. The model definition file provides information associated with the device model. Referring to FIG. 4, the model definition file 400 comprises a general model information field 410, a parameter definition field 420, and an operation point definition field 430. The general model information field 410 includes general information about the device model, such as model name, model version, compatible circuit simulators, model type and binning information. The parameter definition field 420 defines the parameters in the model. For each parameter, the model definition file specifies information associated with the parameter, such as parameter name, default value, parameter unit, data type, and optimization information. The operation point definition section 430 defines operation point or output variables, such as device terminal currents, threshold voltage, etc., used by the model. In one embodiment of the present invention, the selected model is a scalable MOSFET device model such as BSIM3, BSIM4, BSIMPD, etc.

The regional global model generation step 230 further includes substep 234 in which a G-type subregion is selected, and substep 236 in which regional global model parameters associated with the G-type subregion are extracted so that a regional global model is generated for the subregion Afterwards, if it is determined in substep 238 that more G-type subregions are available for regional global model generation, another G-type subregion is selected and a regional global model is generated for that subregion. This process continues until a regional global model is generated for each of the G-type subregions.

Figure 5A:
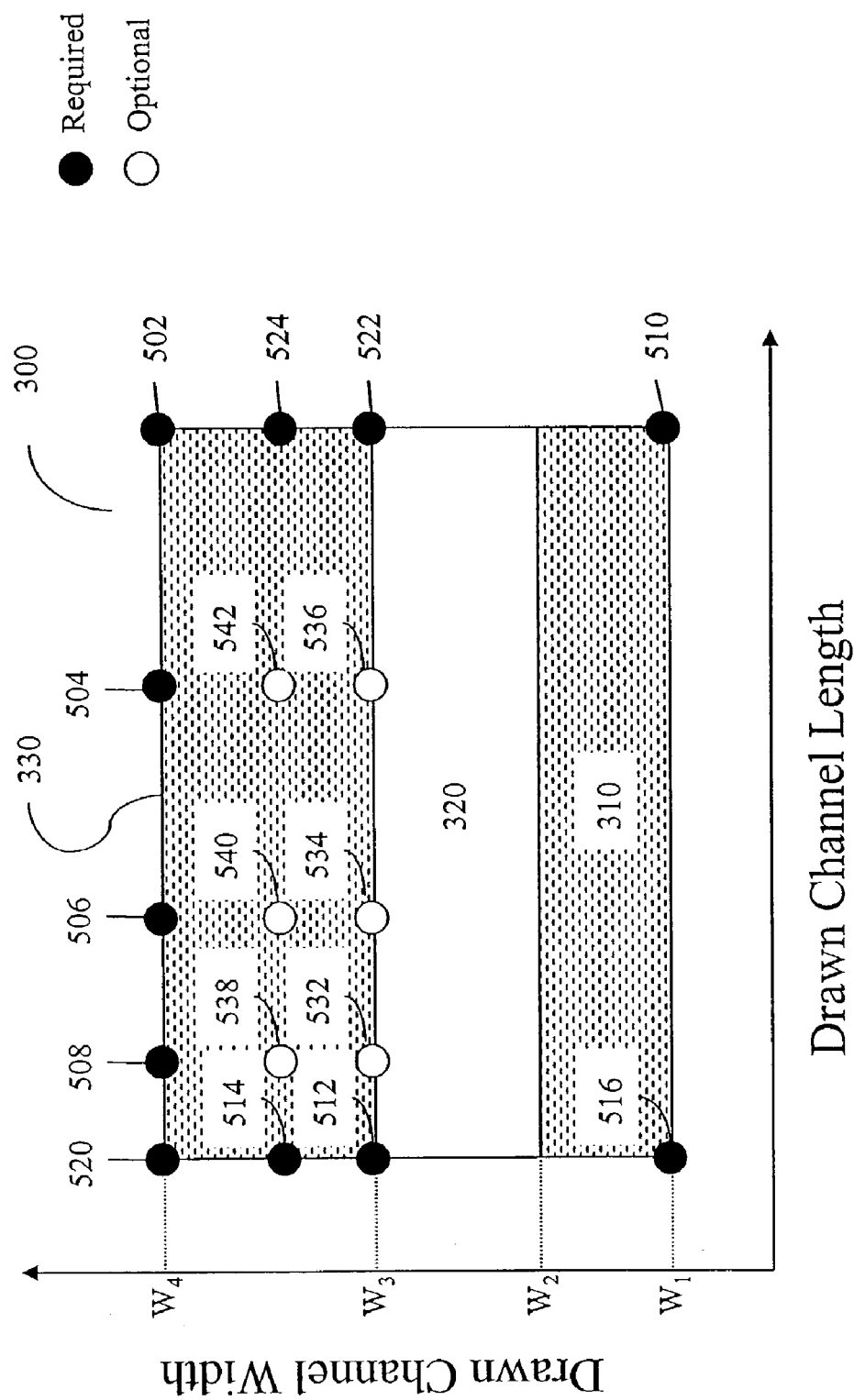
FIG. 5A is a graph illustrating test device geometries used to obtain experimental data for extracting regional global model parameters in accordance with an embodiment of the present invention.

During the extraction substep 236, model equations associated with the selected device model and measurement data from a plurality of test devices are used to extract the model parameters associated with a selected subregion. The measurement data include physical measurements from a set of test devices. In one embodiment of the present invention, the measurement data include terminal current data and capacitance data measured from test devices under various bias conditions, and can be obtained using a conventional semiconductor device measurement tool that is coupled to system 100 through input port 104. The measurement data are then organized by CPU 102 and stored in database 114. The test devices are typically manufactured using the same or similar process technologies for fabricating the devices to be modeled. In one embodiment of the present invention, a set of test devices being of the same type as the devices to be modeled are used for the measurement. The requirement for the geometries of the test devices can vary depending on different applications. Ideally, as shown in FIG. 5A, the set of devices for a selected subregion, such as subregion 330, include:

a. one largest device, meaning the device with the longest drawn channel length and widest drawn channel width, as represented by dot 502;

b. one smallest device, meaning the device with the shortest drawn channel length and smallest drawn channel width, as represented by dot 516;

c. one device with the smallest drawn channel width and longest drawn channel length, as represented by dot 510;

d. one device with the widest drawn channel width and shortest drawn channel length, as represented by dot 520;

e. three devices having the widest drawn channel width and different drawn channel lengths in the selected subregion, as represented by dots 504, 506, and 508;

f. two devices with the shortest drawn channel length and different drawn channel widths in the selected subregion, as represented by dots 512 and 514;

g. two devices with the longest drawn channel length and different drawn channel widths in the selected subregion, as represented by dots 522 and 524;

h. (optionally) up to three devices with smallest drawn channel width and different drawn channel lengths in the selected subregion, as represented by dots 532, 534, and 536; and i. (optionally) up to three devices with medium drawn channel width (about halfway between the widest and smallest drawn channel width) and different drawn channel lengths in the selected subregion, as represented by dots 538, 540, and 542.

Figure 5B:
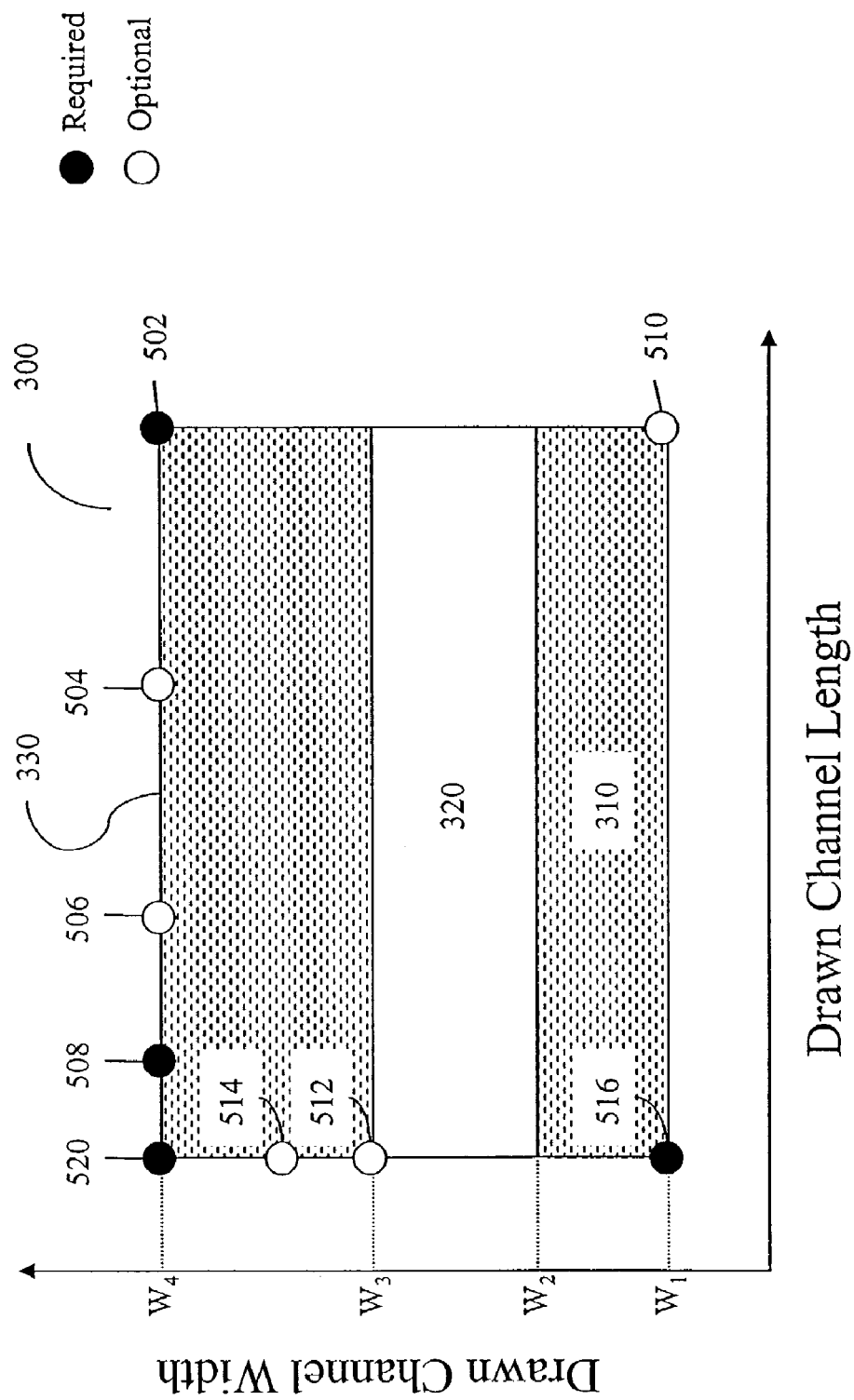
FIG. 5B is a graph illustrating test device geometries used to obtain experimental data for extracting regional global model parameters in accordance with an alternative embodiment of the present invention.

If in practice, it is difficult to obtain measurements for all of the above required devices sizes, a smaller set of different sized devices can be used. For example, the different device sizes shown in FIG. 5B are sufficient for extracting model parameters for subregion 330, according to one embodiment of the present invention. The test devices as shown in FIG. 5B include:

a. one largest device, meaning the device with the longest drawn channel length and widest drawn channel width, as represented by dot 502;

b. one smallest device, meaning the device with the shortest drawn channel length and smallest drawn channel width, as represented by dot 516;

c. (optional) one device with the smallest drawn channel width and longest drawn channel length, as represented by dot 510;

d. one device with the widest drawn channel width and shortest drawn channel length, as represented by dot 520;

e. one device and two optional devices having the widest drawn channel width and different drawn channel lengths in the selected subregion, as represented by dots 504, 506, and 508, respectively;

f. (optional) two devices with the shortest drawn channel length and different drawn channel widths in the selected subregion, as represented by dots 512 and 514.

For a given device model, there are usually different ways to extract the model parameters. Also, depending on the type of devices to be modeled, the specific device model used to model the devices, or the specific method of extracting the model parameters associated with the device model, different measurement data may need to be taken from test devices. As an example, when the devices to be modeled are MOSFET devices and version 2 of the BSIM3 model is used for the modeling, the types of data to be measured and the model parameter extraction method described by Yuhua Cheng and Chenming Hu in "MOSFET Modeling & BSIM3 User's Guide," Kluwer Academic Publishers, 1999, which is incorporated herein by reference in its entirety, can be used to generate the regional global models. As another example, when the BSIM4 model is used to model the MOSFET devices, the types of data to be measured and the model parameter extraction method described in Provisional Patent Application No. 60/407,251 filed on Aug. 30, 2002, which is incorporated herein by reference in its entirety, can be used to generate the regional global models. As yet another example, when the devices to be modeled are silicon-on-insulator(SOI) MOSFET devices and the BSIMPD model is used, the types of data to be measured and the model parameter extraction method described below and also in Provisional Patent Application Ser. No. 60/368,599 filed on Mar. 29, 2002, which is incorporated herein by reference in its entirety, can be used to generate regional global models. Some aspects of the model parameter extraction methods for the BSIM4 and BSIMPD models are described in the "BSIMPro+User Manual—Device Modeling Guide," by Celestry Design Company, 2001, which is also incorporatated herein by reference in its entirety.

Figure 6:
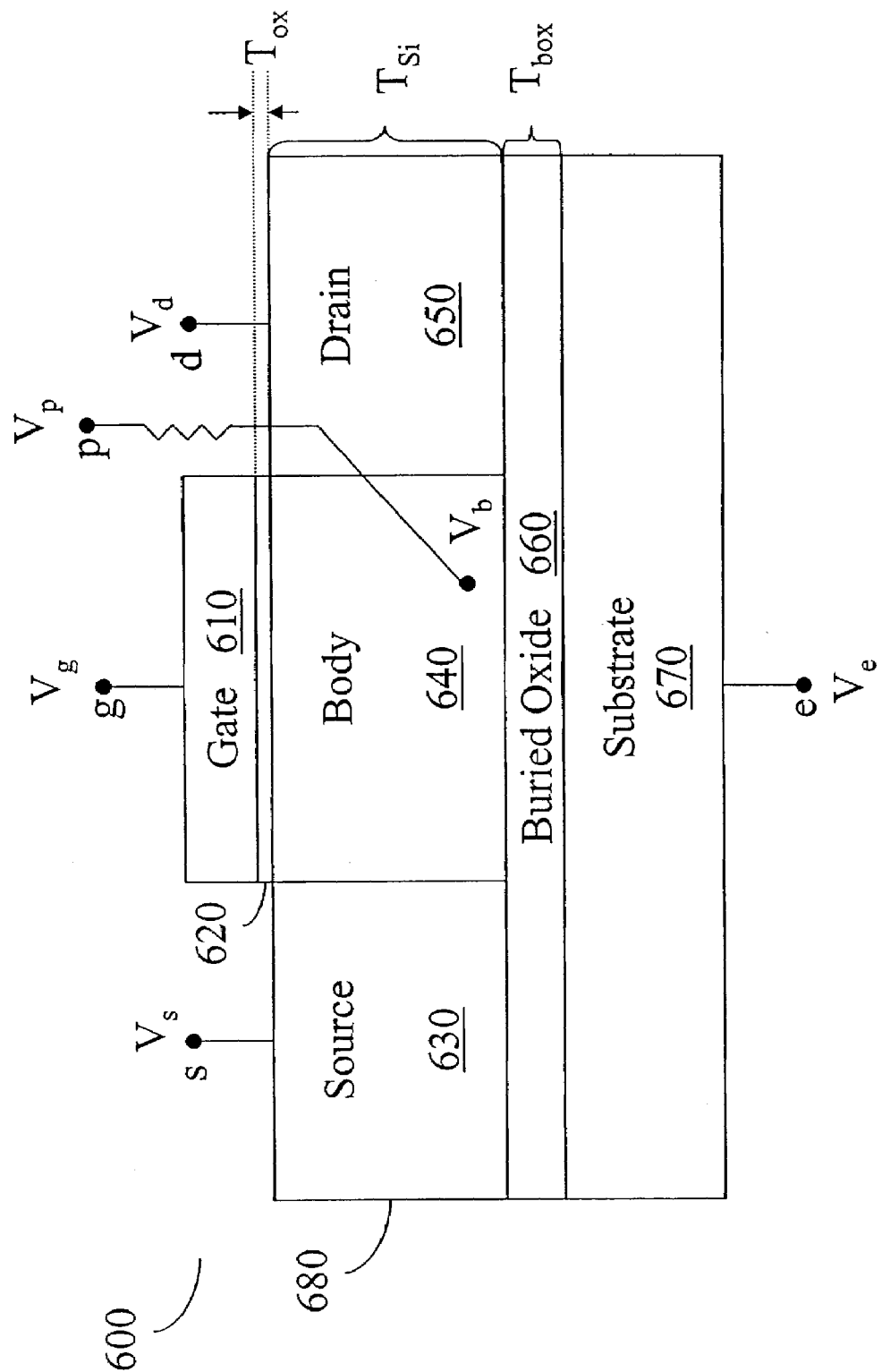
FIG. 6 is a diagrammatic cross sectional view a of a silicon-on-insulator MOSFET device for which model parameters are extracted in accordance with an embodiment of the present invention.

Although the embodiments of the present invention can be applied to many different methods for extracting model parameters for many different types of devices, the parameter extraction process for a SOI MOSFET device is described below to aid in the understanding of one embodiment of the present invention. The present invention, however, is not limited to the type of devices to be modeled, the specific device model used to model the devices, or the specific method used to extract the associated model parameters. As shown in FIG. 6, a SOI MOSFET device 600 may comprise a thin silicon on oxide (SOI) film 680, having a thickness $T_{si}$, on top of a layer of buried oxide 660, having a thickness $T_{box}$. The SOI film 680 has two doped regions, a source 630 and a drain 650, separated by a body region 640. The SOI MOSFET also comprises a gate 610 on top of the body region 640 and is separated from SOI film 680 by a thin layer of gate oxide 620. The SOI MOSFET 600 is formed on a semiconductor substrate 670.

The SOI MOSFET as described can be considered a five terminal (node) device. The five terminals are the gate terminal (node g), the source terminal (node s), the drain terminal (node d), the body terminal (node p), and the substrate terminal (node e). Nodes g, s, d, and e can be connected to different voltage sources while node p can be connected to a voltage source or left floating. In the floating body configuration there are four external biases, the gate voltage ($V_g$), the drain voltage ($V_d$), the source voltage ($V_s$) and the substrate bias $V_e$. If body contact is applied, there will be an additional external bias, the body contact voltage ($V_p$).

For ease of further discussion, Table I below lists the symbols corresponding to the physical variables associated with the operation of SOI MOSFET device 600.

TABLE I

| | |
|---|---|
| $C_{pd}$ | body to drain capacitance |
| $C_{ps}$ | body to source capacitance |
| $I_c$ | parasitic bipolar transistor collector current |
| $I_p$ | current through body (p) node |
| $I_{bjt}$ | parasitic bipolar junction transistor current |
| $I_d$ | current through drain (d) node |
| $I_{dgidl}$ | gate induced leakage current at the drain |
| $I_{diode}$ | diode current |
| $I_{ds}$ | current flowing from source to drain |
| $I_{dsat}$ | drain saturation current |
| $I_e$ | current through substrate (e) node |
| $I_g$ (or $J_{gh}$) | gate oxide tunneling current |
| $I_{gs}$ | current flowing from source to gate |
| $I_{ii}$ | impact ionization current |
| $I_s$ | current through source (s) node |
| $I_{sgidl}$ | gate induced drain leakage current at the source |
| $L_{drawn}$ | drawn channel length |
| $L_{eff}$ | effective channel length |
| $R_d$ | drain resistance |
| $R_s$ | source resistance |
| $R_{ds}$ | drain/source resistance |
| $R_{out}$ | output resistance |
| $V_b$ | internal body voltage |
| $V_{bs}$ | voltage between node p and node s |
| $V_d$ | drain voltage |
| $V_{DD}$ | maximum operating DC voltage |

TABLE I-continued

| | |
|---|---|
| $V_{ds}$ | voltage between node d and node s |
| $V_e$ | substrate voltage |
| $V_g$ | gate voltage |
| $V_{gs}$ | voltage between node g and node s |
| $V_p$ | body contact voltage |
| $V_s$ | source voltage |
| $V_{th}$ | threshold voltage |
| $W_{drawn}$ | drawn channel width |
| $W_{eff}$ | effective channel width |

In order to model the behavior of the SOI MOSFET device 600 using the BSIMPD model, experimental data are used to extract model parameters associated with the model. In one embodiment of the present invention, for each test device, terminal currents are measured under different terminal bias conditions. These terminal current data are put together as I-V curves representing the I-V characteristics of the test device. In one embodiment of the present invention, as listed in FIG. 6, for each test device, the following I-V curves are obtained:

a. Linear region $I_d$ vs. $V_{gs}$ curves for a set of $V_p$ values. These curves are obtained by grounding the s node and e node, setting $V_d$ to a low value, such as 0.05V, and for each of the set of $V_p$ values, measuring $I_d$ while sweeping $V_g$ in step values across a range such as from 0 to $V_{DD}$.

b. Saturation region $I_d$ vs. $V_{gs}$ curves for a set of $V_p$ values. These curves are obtained by grounding the s node and e node, setting $V_d$ to a high value, such as $V_{DD}$, and for each of the set of $V_p$ values, measuring $I_d$ while sweeping $V_g$ in step values across a range such as from 0 to $V_{DD}$.

c. $I_d$ vs. $V_{gs}$ curves for different $V_d$, $V_p$ and $V_e$ values, obtained by grounding s node, and for each combination of $V_d$, $V_p$ and $V_e$ values, measuring $I_d$ while sweeping $V_g$ in step values across a range such as from $-V_{DD}$ to $V_{DD}$.

d. $I_g$ vs. $V_{gs}$ curves for different $V_d$, $V_p$ and $V_e$ values, obtained by grounding s node, and for each combination of $V_d$ $V_p$ and $V_e$ values, measuring $I_g$ while sweeping $V_g$ in step values across a range such as from $-V_{DD}$ to $V_{DD}$.

e. $I_s$ vs. $V_{ds}$ curves for different $V_g$, $V_p$ and $V_e$ values, obtained by grounding s node, and for each combination of $V_g$, $V_p$ and $V_e$ values, measuring $I_s$ while sweeping $V_d$ in step values across a range such as from 0 to $V_{DD}$.

f. $I_p$ vs. $V_{gs}$ curves for different $V_d$, $V_p$ and $V_e$ values, obtained by grounding s node, and for each combination of $V_d$, $V_p$ and $V_e$ values, measuring $I_p$ while sweeping $V_g$ in step values across a range such as from $-V_{DD}$ to $V_{DD}$.

g. $I_d$ vs. $V_{gs}$ curves for different $V_d$, $V_p$ and $V_e$ values, obtained by grounding s node, and for each combination of $V_p$, $V_d$ and $V_e$ values, measuring $I_d$ while sweeping $V_g$ in step values across a range such as from $-V_{DD}$ to $V_{DD}$.

h. $I_d$ vs. $V_{ps}$ curves for different $V_d$, $V_g$ and $V_e$ values, obtained by grounding s node, and for each combination of $V_g$, $V_d$ and $V_e$ values, measuring $I_d$ while sweeping $V_p$ in step values across a range such as from $-V_{DD}$ to $V_{DD}$.

i. Floating body $I_d$ vs. $V_{gs}$ curves for different $V_d$ and $V_e$ values, obtained by grounding s node, floating b node, and for each combination of $V_d$ and $V_e$ values, measuring $I_d$ while sweeping $V_g$ in step values across a range such as from 0 to $V_{DD}$.

j. Floating body $I_d$ vs. $V_{ds}$ curves for different $V_g$ and $V_e$ values, obtained by grounding s node, floating b node, and for each combination of $V_d$ and $V_e$ values, measuring $I_d$ while sweeping $V_g$ in step values across a range such as from 0 to $V_{DD}$.

Figure 7:
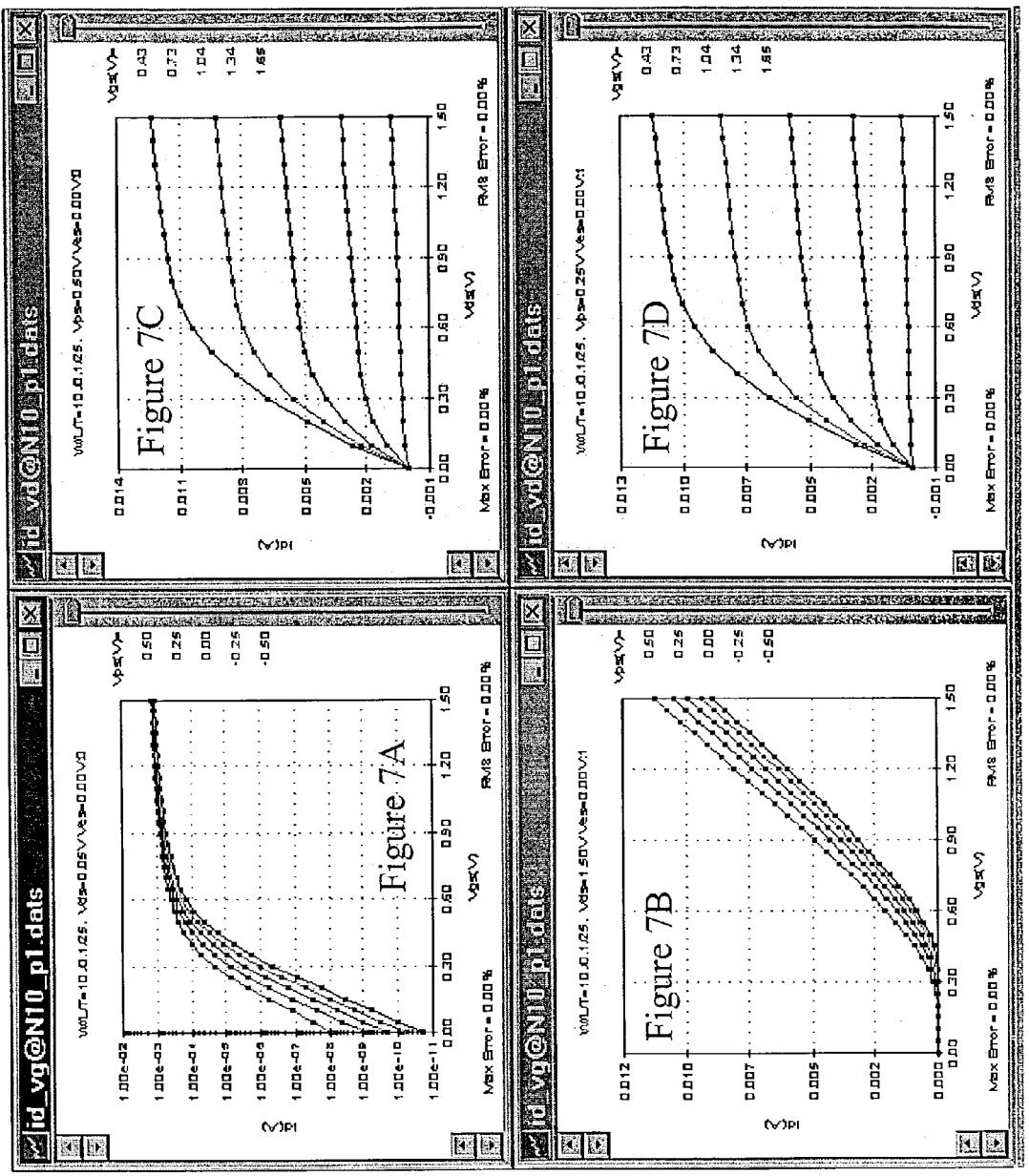
FIGS. 7A-7D are examples of current-voltage (I-V) curves representing some of the terminal current data for the test devices.

As examples, FIG. 7A shows a set of linear region $I_d$ vs. $V_{gs}$ curves for different $V_{ps}$ values, FIG. 7B shows a set of saturation region $I_d$ vs. $V_{gs}$ curves for different $V_{ps}$ values, FIG. 7C shows a set of $I_d$ vs. $V_{ds}$ curves for different $V_{gs}$ values while $V_{ps}$=0.5V and $V_{es}$=0; FIG. 7D shows a set of $I_d$ vs. $V_{ds}$ curves for different $V_{gs}$ values while $V_{ps}$=0.25V and $V_{es}$=0.

In addition to the terminal current data, for each test device, capacitance data are also collected from the test devices under various bias conditions. The capacitance data can be put together into capacitance-current (C-V) curves. In one embodiment of the present invention, the following C-V curves are obtained:

a. $C_{ps}$ vs. $V_{ps}$ curve obtained by grounding s node, setting $I_e$ and $I_d$ to zero, or to very small values, and measuring $C_{ps}$ while sweeping $V_p$ in step values across a range such as from $-V_{DD}$ to $V_{DD}$.

b. $C_{pd}$ vs. $V_{ps}$ curve obtained by grounding s node, setting $I_e$ and $I_s$ to zero, or to very small values, and measuring $C_{pd}$ while sweeping $V_p$ in step values across a range such as from $-V_{DD}$ to $V_{DD}$.

Figure 8:
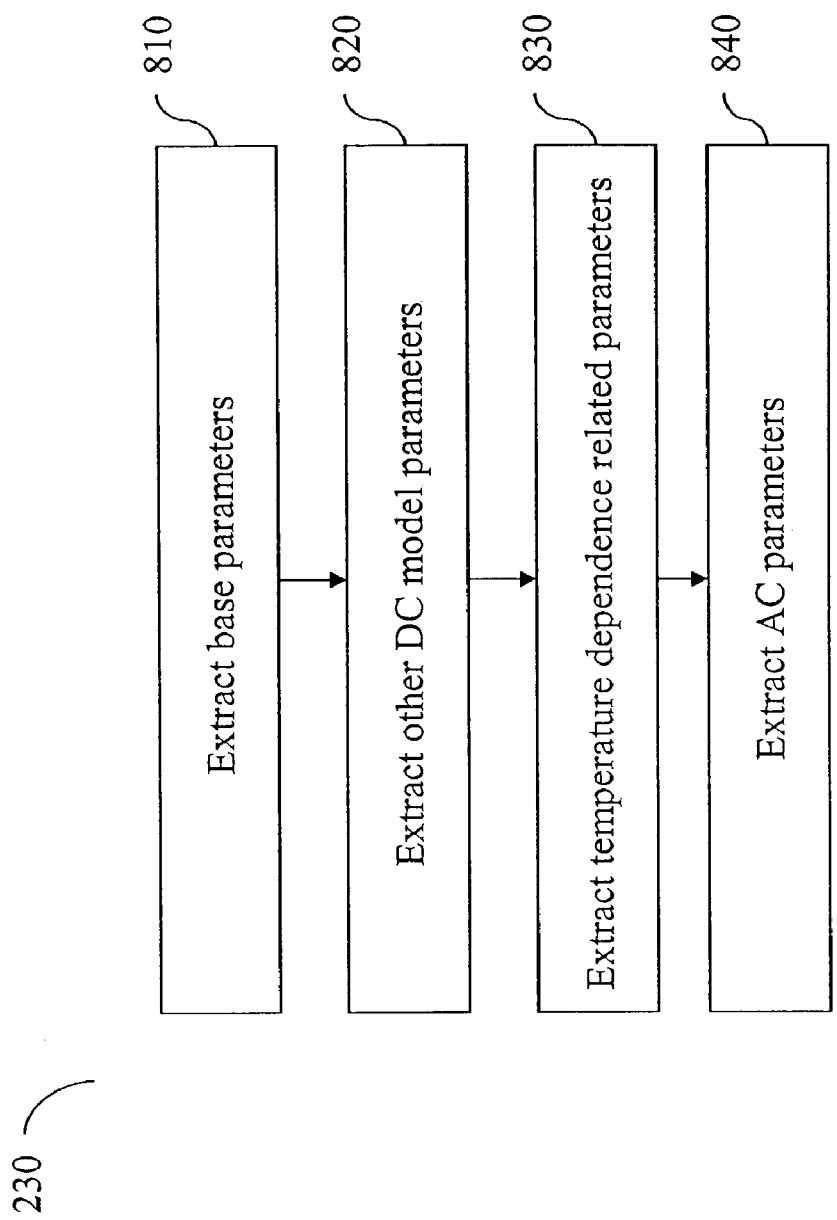
FIG. 8 is a flow chart illustrating in further detail a parameter extraction process in accordance with an embodiment of the present invention.

A list of the model parameters in the BSIMPD model are provided in Appendix A. The BSIMPD model is described in more detail in the "BSIM4.0.0 MOSFET Model—User's Manual," by Liu, et al., Department of Electrical Engineering and Computer Sciences, University of California, Berkeley, 2000, which is incorporated herein by reference. As shown in FIG. 8, in one embodiment of the present invention, the parameter extraction step 230 comprises extracting base parameters 810; extracting other DC model parameters 820; extracting temperature dependent related parameters 830; and extracting AC parameters 840. In base parameters extraction step 810, base parameters, such as $V_{th}$ (the threshold voltage at $V_{bs}$=0), $K_1$ (the first order body effect coefficient), and $K_2$ (the second order body effect coefficient) are extracted based on process parameters corresponding to the process technology used to fabricate the SOI MOSFET device to be modeled. The base parameters are then used to extract other DC model parameters at step 820, which is explained in more detail in connection with FIGS. 9, 10, and 11 below.

The temperature dependent parameters are parameters that may vary with the temperature of the device and include parameters such as: Ktl1 (temperature coefficient for threshold voltage); Ua1 (temperature coefficient for $U_a$), and Ub1 (temperature coefficient for $U_b$), etc. These parameters can be extracted using a conventional parameter extraction method.

The AC parameters are parameters associated with the AC characteristics of the SOI MOSFET device and include parameters such as: CLC (constant term for the short chanel model) and moin (the coefficient for the gate-bias dependent surface potential), etc. These parameters can also be extracted using a conventional parameter extraction method.

Figure 9:
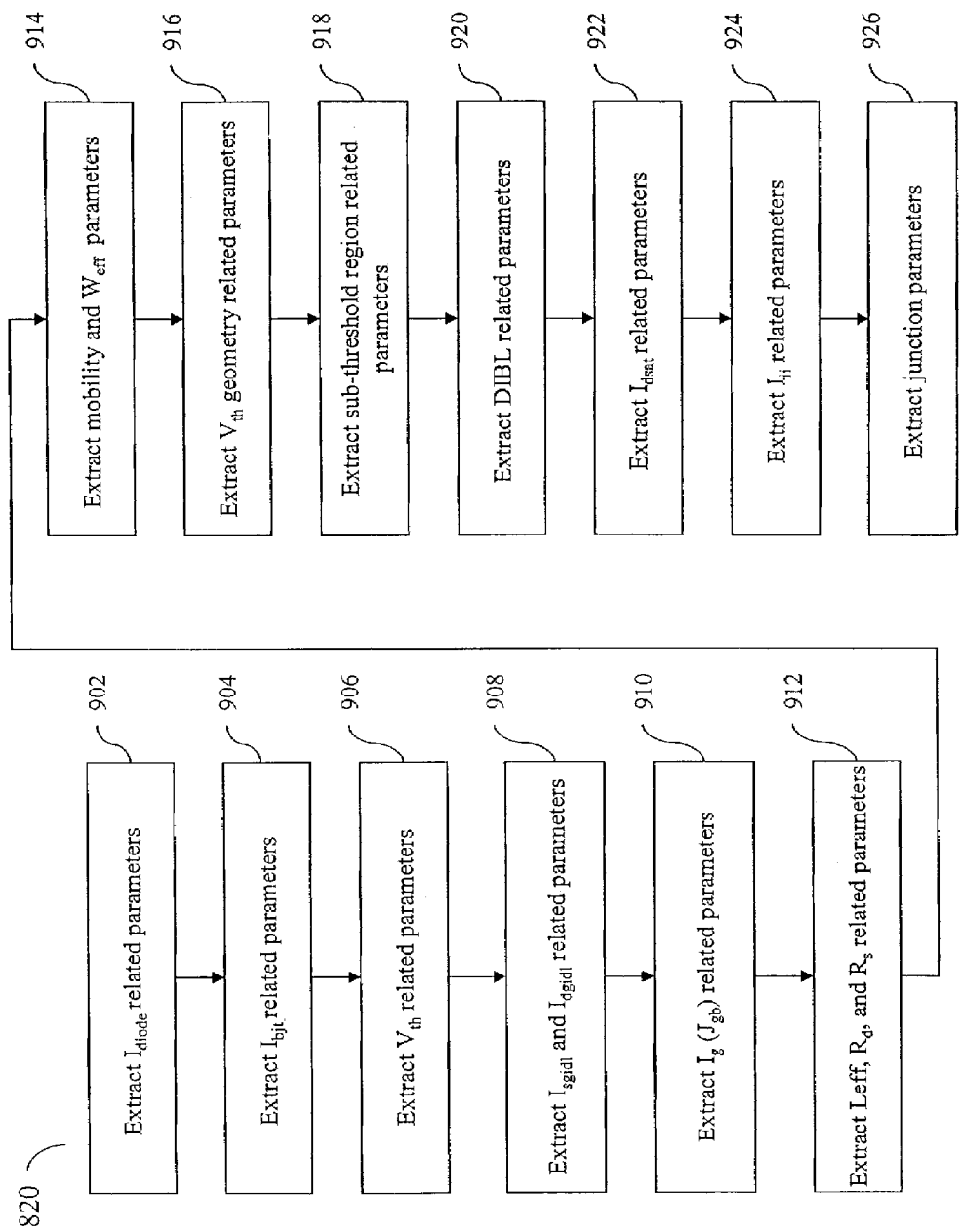
FIG. 9 is a flow chart illustrating in further detail a DC parameter extraction process in accordance with an embodiment of the present invention.
Figure 10:
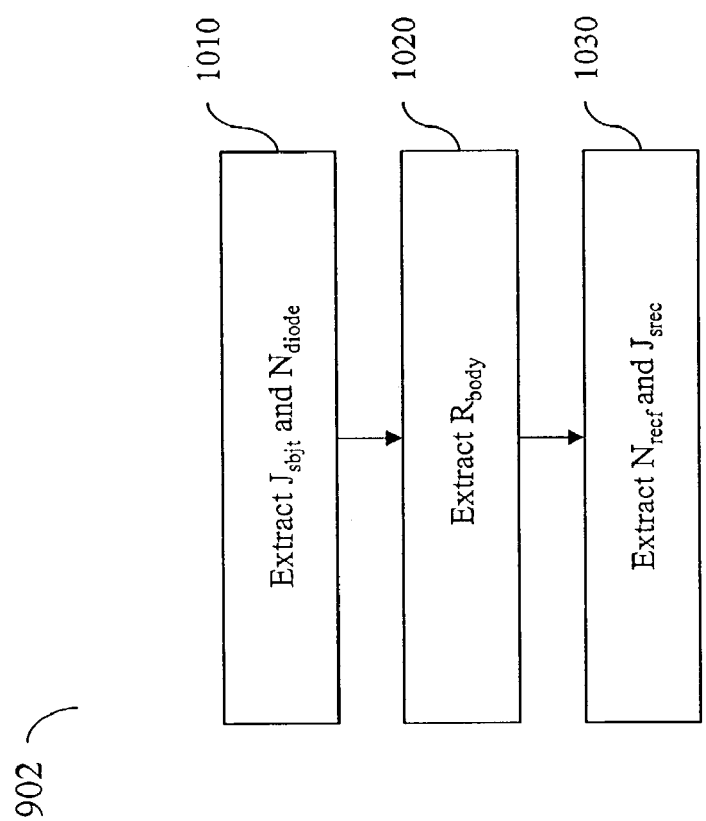
FIG. 10 is a flow chart illustrating a process for extracting diode current related parameters in accordance with an embodiment of the present invention.

As shown in FIG. 9, the DC parameter extraction step 820 further comprises: extracting $I_{diode}$ related parameters (step 902); extracting $I_{bjt}$ related parameters (step 904); extracting $V_{th}$ related parameters (step 906); extracting $I_{dgid1}$ and $I_{sgid1}$ related parameters (step 908); extracting $I_g$ (or $J_{gb}$) related parameters (step 910); extracting $L_{eff}$ related parameters, $R_d$ related parameters, and $R_s$ related parameters (step 912); extracting mobility related parameters and $W_{eff}$ related parameters (step 914); extracting $V_{th}$ geometry related parameters (step 916); extracting sub-threshold region related parameters (step 918); extracting parameters related to drain-induced barrier lower than regular (DIBL) (step 920); extracting $I_{dsat}$ related parameters (step 922); extracting $I_{ii}$ related parameters (step 924); and extracting junction parameters (step 926).

The equation numbers below refer to the equations set forth in Appendix B.

In step 902, parameters related to the calculation of the diode current $I_{diode}$ are extracted. These parameters include, $J_{sbjt}$, $n_{dio}$, $R_{body}$, $n_{recf}$ and $j_{srec}$. As shown in more detail in FIG. 10, step 902 comprises: extracting $J_{sbjt}$ and $n_{dio}$ (step 1010); extracting $R_{body}$ (step 1020); and extracting $n_{recf}$ and $j_{srec}$ (step 1030).

Model parameters $J_{sbjt}$ and $n_{dio}$ are extracted in step 1010 from the recombination current in neutral body equations (Equations 14.5a-14.5.f) using measured data in the middle part of the $I_d$ vs $V_{ps}$ curves taken from the largest test device (test device having longest $L_{drawn}$ and widest $W_{drawn}$). By using the largest device, $\alpha_{bjt} \to 0$. Then, assuming $A_{hli} = 0$, $E_{hlid}$ will also equal zero. Therefore Equations 14.5.d-14.5.f can be eliminated. The set of equations is thus reduced to two equations (14.5.b and 14.5.c) with two unknowns, resulting in quick solution for $J_{sbjt}$ and $n_{dio}$. In one embodiment of the present invention, the middle part of an $I_d$ vs $V_{ps}$ curve corresponds to the part of the $I_d$ vs $V_{ps}$ curve with $V_{ps}$ ranging from about 0.3V to about 0.8V. In another embodiment, the middle part of the $I_d$ vs $V_{ps}$ curve corresponds to $V_{ps}$ ranging from about 0.4V to about 0.7V.

$R_{body}$ is extracted in step 1020 from the body contact current equation (Equations 13.1-13.3) using measured data in the high current part of the $I_d$ vs $I_{ps}$ curves. In one embodiment of the present invention, the high current part of an $I_d$ vs $V_{ps}$ curve corresponds to the part of the $I_d$ vs $V_{ps}$ curve with $V_{ps}$ ranging from about 0.8V to about 1V.

The first order parameters, $n_{recf}$ and $j_{srec}$ are extracted in step 1030 from the recombination/trap-assist tunneling current in depletion region equations (Equations 14.3.a and 14.3.b), also using the $I_d$ vs $I_{ps}$ curves taken from one shortest device. The remaining $I_{diode}$ related parameters are second order parameters and may be neglected.

Referring back to FIG. 9, the parasitic lateral bipolar junction transistor current ($I_{bjt}$) related parameter $L_n$ is extracted in step 904. In this step, a set of $I_c/I_p$ vs. $V_{ps}$ curves are constructed from the $I_d$ vs. $V_{ps}$ curves taken from one shortest device. Then the bipolar transport factor equations (Equation 14.1) wherein $I_c/I_b = \alpha_{bjt}/1 - \alpha_{bjt}$ are used to extract $L_n$.

In step 906, threshold voltage $V_{th}$ related parameters, such as $V_{th0}$, k1, k2, and Nch, are extracted by using the linear $I_d$ vs $V_g$ curves measured from the largest device.

In step 908, parameters related to the gate induced drain leakage current at the drain and at the source ($I_{dgid1}$) and the gate induced drain leakage current at the source ($I_{sgid1}$,) are extracted. The $I_{dgid1}$ and $I_{sgid1}$ related parameters include parameters such as $\alpha_{gid1}$ and $\beta_{gid1}$, and are extracted using the $I_d$ vs. $V_g$ curves and Equations 12.1 and 12.2.

In step 910 the oxide tunneling current ($I_g$, also designated as $J_{gb}$) related parameters are extracted. The $I_g$ related parameters include parameters such as $V_{EvB}$, $\alpha_{gb1}$, $\beta_{gb1}$, $V_{gb1}$, $V_{ECB}$, $\alpha_{gb2}$, $\beta_{gb2}$, and $V_{gb2}$, and are extracted using the $I_g$ vs. $V_g$ curves and equations 17.1a-f and 17.2 a-f.

In step 912, parameters related to the effective channel length $L_{eff}$ the drain resistance $R_d$ and source resistance $R_s$ are extracted. The $L_{eff}$, $R_d$ and $R_s$ related parameters include parameters such as $L_{int}$, and $R_{dsw}$ and are extracted using data from the linear $I_d$ vs $V_g$ curves as well as the extracted $V_{th}$ related parameters from step 906.

In step 914, parameters related to the mobility and effective channel width $W_{eff}$, such as $\mu_0$, $U_a$, $U_b$, $U_c$, Wint, Wri, Prwb, Wr, Prwg, $R_{dsw}$, Dwg, and Dwb, are extracted, using the linear $I_d$ vs $V_g$ curves, the extracted $V_{th}$, and $L_{eff}$, $R_d$ and $R_s$ related parameters from steps 906 and 912.

Steps 906, 912, and 914 can be performed using a conventional BSIMPD model parameter extraction method. Discussions about some of the parameters involved in these steps can be found in: "A new method to determine effective MOSFET channel length," by Terada K. and Muta H, Japan J Appl. Phys. 1979:18:953-9; "A new Method to determine MOSFET channel length," by Chern J., Chang P., Motta R., and Godinho N., IEEE Trans Electron Dev 1980: ED-27: 1846-8; and "Drain and source resistances of short-channel LDD MOSFETs," by Hassan Md Rofigul, et al., Solid-State Electron 1997:41:778-80; which are incorporated by reference herein.

In step 916, the threshold voltage $V_{th}$ geometry related parameters, such as $D_{VT0}$, $D_{VT1}$, $D_{VT2}$, $N_{LX1}$, $D_{VT0W}$, $D_{VT1W}$, $D_{VT2W}$, $k_3$, and $k_{3b}$, are extracted, using the linear $I_d$ vs $V_g$ curve, the extracted $V_{th}$, $L_{eff}$, and mobility and $W_{eff}$ related parameters from steps 906, 912, and 914, and Equations 3.1 to 3.10.

In step 918, sub-threshold region related parameters, such as $C_{it}$, Nfactor, $V_{off}$, $D_{dsc}$, and $C_{dscd}$, are extracted, using the linear $I_d$ vs $V_{gs}$ curves, the extracted $V_{th}$, $L_{eff}$ and $R_d$ and $R_s$ and mobility and $W_{eff}$ related parameters from steps 906, 912, and 914, and Equations 5.1 and 5.2.

In step 920, DIBL related parameters, such as $D_{sub}$, Eta0 and Etab, are extracted, using the saturation $I_d$ vs $V_{gs}$ curves and the extracted $V_{th}$ related parameters from step 906, and Equations 3.1 to 3.10.

In step 922, the drain saturation current $I_{dsat}$ related parameters, such as B0, B1, A0, Keta, and $A_{gs}$, are extracted using the saturation $I_d$ vs $V_d$ curves, the extracted $V_{th}$, $L_{eff}$ and $R_d$ and $R_s$, mobility and $W_{eff}$, $V_{th}$ geometry, sub-threshold region, and DIBL related parameters from steps 906, 912, 914, 916, and 918, and Equations 9.1 to 9.10.

In step 924, the impact ionization current $I_{ii}$ related parameters, such as $\alpha_0$, $\beta_0$, $\beta_1$, $\beta_2$, $V_{dsatii}$, and $L_{ii}$, are extracted, as discussed in detail in relation to FIG. 11 below.

Figure 11:
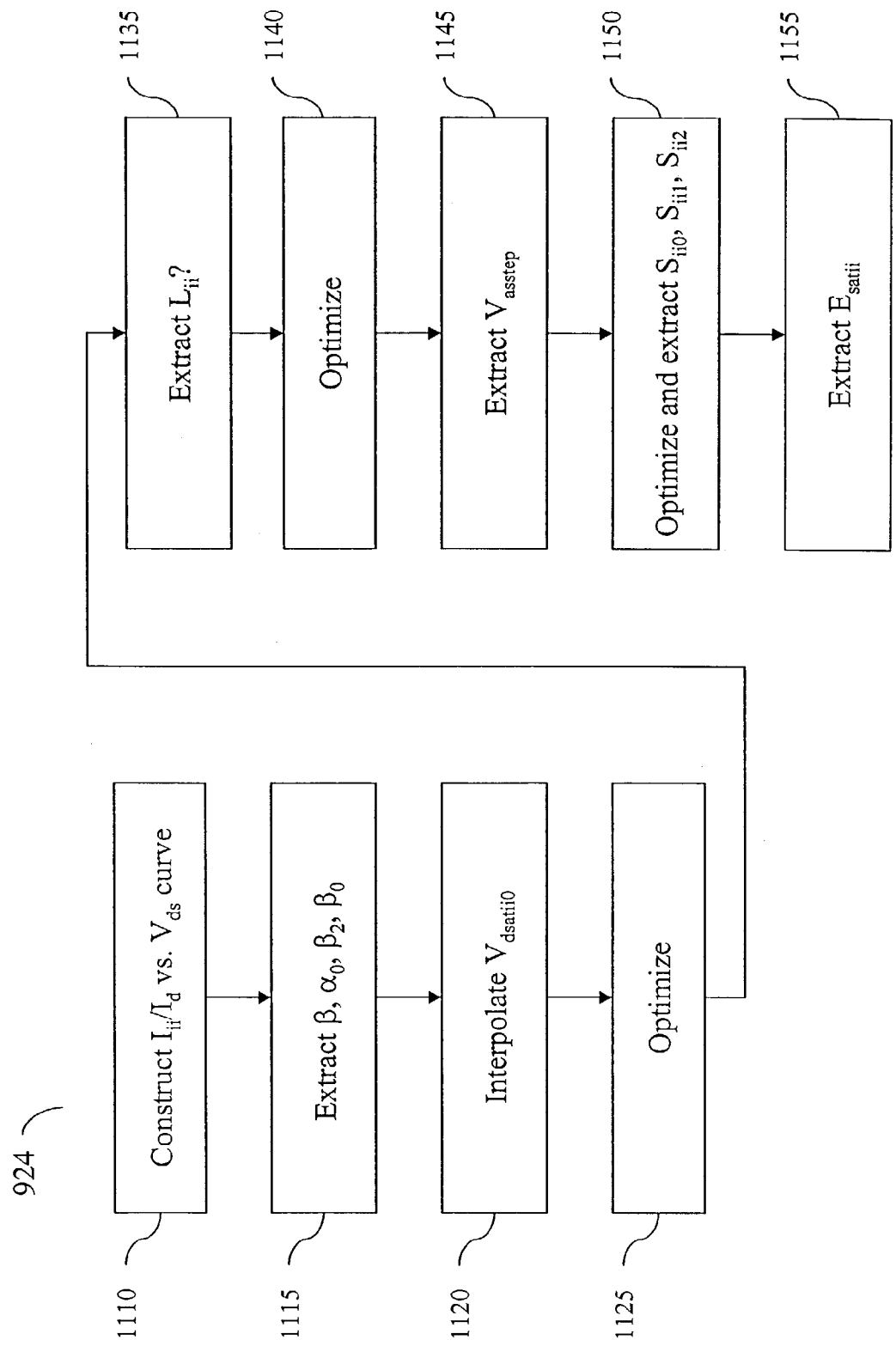
FIG. 11 is a flow chart illustrating a process for extracting impact ionization current related parameters in accordance with an embodiment of the present invention.

FIG. 11 is a flow chart illustrating in further detail the extraction of the impact ionization current $I_{ii}$ related parameters (step 924). In one embodiment of the present invention, data from the $I_p$ v $V_{gs}$ and $I_d$ v $V_{gs}$ curves measured from one or more shortest devices are used to construct the $I_{ii}/I_d$ vs $V_{ds}$ curves for the one or more shortest devices (step 1110). This begins by identifying the point where $V_{gs}$ is equal to $V_{th}$ for each $I_p$ v $V_{gs}$ curve. This point is found by setting $V_{gst} = 0$. When $V_{gst} = 0$, $V_{gsstep} = 0$. Then, using the impact ionization current equation, Equation 11.1, the $I_{ii}/I_d$ vs $V_{ds}$ curve can be obtained.

After the $I_{ii}/I_d$ vs $V_{ds}$ curve is obtained, $L_{ii}$ is set equal to zero and $V_{dsatii0}$ is set to 0.8 (the default value). Using the $I_{ii}/I_d$ vs $V_{ds}$ curve $\beta_1$, $\alpha_0$, $\beta_2$, $\beta_0$ are extracted 1115 from the impact ionization current equation for $I_{ii}$, Equation 11.1.

In 1120, $V_{dsatii}$ is interpolated from a constructed $I_{ii}/I_d$ vs $V_{ds}$ curve by identifying the point at which $I_p/I_d = \alpha_0$.

Following the interpolation, using a conventional optimizer such as the Newton-Raphson algorithm, $\beta_1$, $\beta_2$, $\beta_0$ are optimized 1125.

Step 1120 is repeated for each constructed $I_{ii}/I_d$ vs $V_{ds}$ curve. This results in an array of values for $V_{dsatii}$. Using these values for $V_{dsatii}$, $L_{ii}$ is extracted 1135 from the $V_{dsatii}$ equation for the impact ionization current (Equation 11.3).

The extracted $\beta_1$, $\alpha_0$, $\beta_2$, $\beta_0$, $L_{ii}$, and $V_{dsatii0}$ are optimized at step 1140 by comparing calculated and measured $I_{ii}/I_d$ vs $V_{ds}$ curves for the one or more shorted devices.

The next step, 1145 uses the extracted parameters from the $I_{ii}$ and $V_{dsatii}$ equations to calculate $V_{gsstep}$ using Equation 11.4 for the largest device. Then 1150, using a local optimizer such as the Newton Raphson algorithm, and the $V_{gsstep}$ equation, Equation 11.4, $S_{ii1}$, $S_{ii2}$, $S_{ii0}$ are determined.

In the next step 1155 the last of the $I_{ii}$ related parameters is extracted using the shortest device. In this step, $E_{satii}$ is solved for by using the $V_{gsstep}$ equation, Equation 11.4, and the $I_{ii}/I_d$ vs $V_{ds}$ curve. The extraction of the $I_{ii}$, related parameters is complete.

Referring back to FIG. 9, in step 926, the junction parameters, such as Cjswg, Pbswg, and Mjswg, are extracted using the $C_{ps}$ vs. $V_{ps}$ and $C_{pd}$ vs. $V_{ps}$ curves, and Equations 21.4.b.1 and 21.4.b.2.

In performing the DC parameter extraction steps (steps 901-926), it is preferred that after the $I_{diode}$ and $I_{bjt}$ related parameters are extracted in steps 902 and 904, $I_{diode}$ and $I_{bjt}$ are calculated based on these parameters and the model equations. This calculation is done for the bias condition of each data point in the measured I-V curves. The I-V curves are then modified for the first time based on the calculated $I_{diode}$ and $I_{bjt}$ values. In one embodiment of the present invention, the I-V curves are first modified by subtracting the calculated $I_{diode}$ and $I_{bjt}$ values from respective $I_s$, $I_d$, and $I_p$ data values. For example, for a test device having drawn channel length $L_T$ and drawn channel width $W_T$, if under bias condition where $V_s = V_s^T$, $V_d = V_d^T$, $V_p = V_p^T$, $V_e = V_e^T$, and $V_g = V_g^T$, the measured drain current is $I_d^T$, then after the first modification, the drain current will be $I_d^{first-modifies} = I_d^T - I_{diode}^T - I_{bjt}^T$, where $I_{diode}^T$ and $I_{bjt}^T$ are calculated $I_{diode}$ and $I_{bjt}$ values, respectively, for the same test device under the same bias condition. The first-modified I-V curves are then used for additional DC parameter extraction. This results in higher degree of accuracy in the extracted parameters. In one embodiment the $I_{diode}$ and $I_{bjt}$ related parameters are extracted before extracting other DC parameters, so that I-V curve modification may be done for more accurate parameter extraction. However, if such accuracy is not required, one can choose not to do the above modification and the $I_{diode}$ and $I_{bjt}$ related parameters can be extracted at any point in the DC parameter extraction step 820.

Similalry, after the $I_{dgid1}$, $I_{sgid1}$ and $I_g$ related parameters are extracted in steps 908 and 910, $I_{dgid1}$, $I_{sgid1}$ and $I_g$ are calculated based on these parameters and the model equations. This calculation is done for the bias condition of each data point in the measured I-V curves. The I-V curves or the first-modified I-V curves are then modified or further modified based on the calculated $I_{dgid1}$, $I_{sgid1}$ and $I_g$ values. In one embodiment of the present invention, the I-V curves or modified I-V curves are modified or further modified by subtracting the calculated $I_{dgid1}$, $I_{sgid1}$ and $I_g$ values from respective measured or first-modified $I_s$, $I_d$, and $I_p$ data values. For example, for a test device having drawn channel length $L_T$ and drawn channel width $W_T$, if under bias condition where $V_s = V_s^T$, $V_d = V_d^T$, $V_p = V_p^T$, $V_e = V_e^T$, and $V_g = V_g^T$, the measured drain current is $I_d^T$, then after the above modification or further modification, the drain current will be $I_d^{modified} = I_d^T - I_{dgid1} - I_{sgid1} - I_g$, or $I_d^{further-modified} = I_d^{first-modified} - I_{dgid1} - I_{sgid1} - I_g$, where $I_{dgid1}$, $I_{sgid1}$ and $I_g$ are calculated $I_{dgid1}$, $I_{sgid1}$ and $I_g$ values, respectively, for the same test device under the same bias condition. The modified or further modified I-V curves are then used for additional DC parameter extraction. This results in higher degree of accuracy in the extracted parameters. In one embodiment the $I_{dgid1}$, $I_{sgid1}$ and $I_g$ related parameters are extracted before extracting other DC parameters that can be affected by the modifications, so that I-V curve modification may be done for more accurate parameter extraction. However, if such accuracy is not required, one can choose not to do the above modification and the $I_{dgid1}$, $I_{sgid1}$ and $I_g$ related parameters can be extracted at any point in the DC parameter extraction step 820.

Figure 2C:
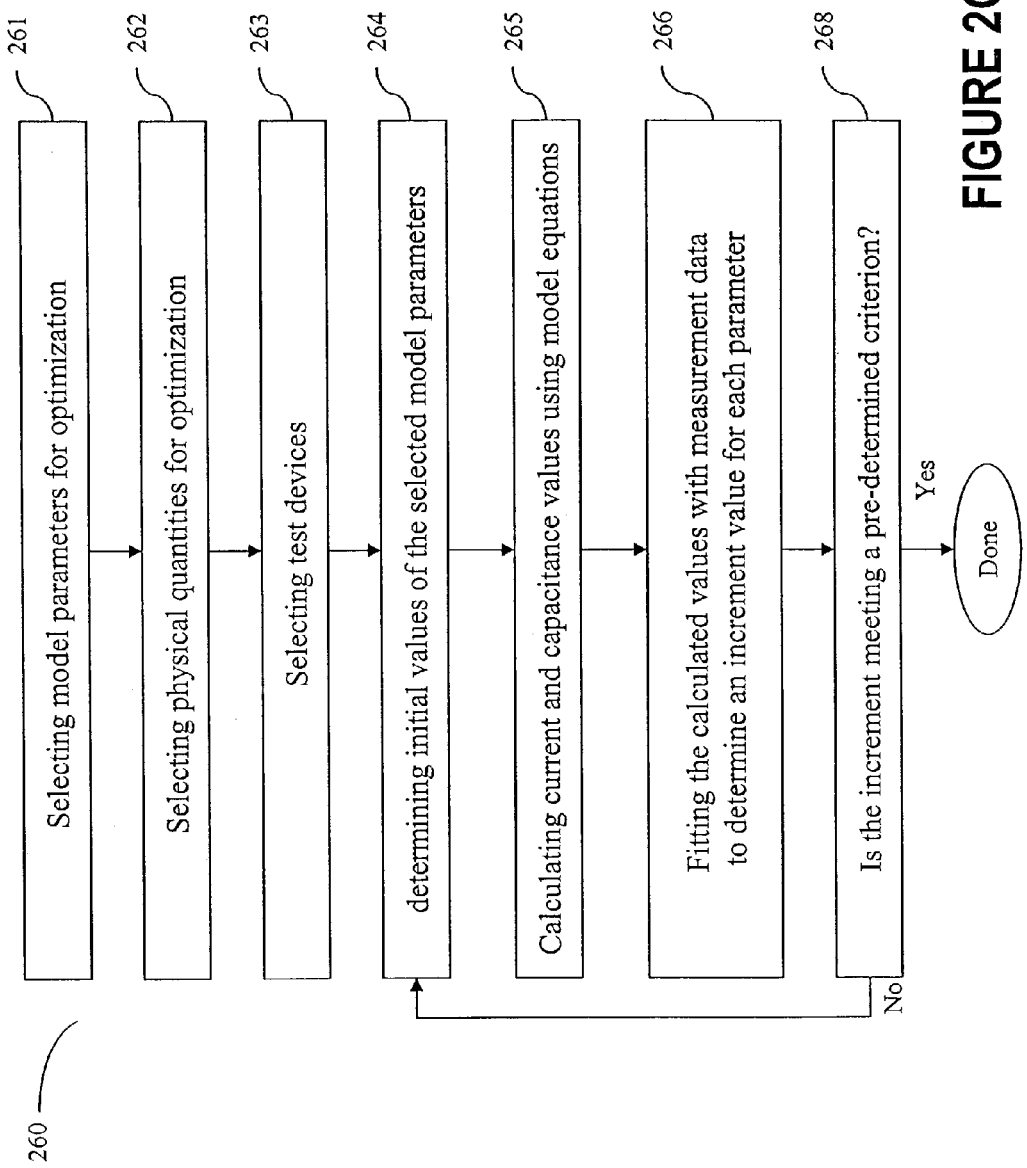
FIG. 2C is a flowchart illustrating an optimization process used in the method for generating regional global models according to one embodiment of the present invention.

A method for extracting model parameters for a scalable device model, such as the ones stated above, usually involves an optimization process in which the differences between calculated and measured values of a set of physical quantities are minimized by adjusting the values of the model parameters. The set of physical quantities include terminal current and/or capacitance values of the devices under various bias conditions, including some of the bias conditions used to obtain measurement data from test devices An exemplary optimization process 260 is illustrated in FIG. 2C, which combines a Newton-Raphson iteration method and a linear-least-square fitting routine. Referring to FIG. 2C, optimization process 260 includes step 261 in which a plurality of model parameters are selected for optimization, and step 262 in which one or more physical quantities are selected from the set of physical quantities for optimization. Optimization process 260 further includes step 263 in which a plurality of test devices are selected from the test devices associated with the selected subregion, as discussed above in connection with FIGS. 5A and 5B. Optimization process 260 further includes step 264 in which initial values of the plurality of model parameters are determined. For example, model parameters extracted for a prior fabrication technology or default values of the model parameters provided by the device model can be used as the initial values of the model parameters. Using the model equations and the initial values of the model parameters, optimization process 260 then proceeds to calculate in step 265 the values of the selected of physical quantitie(s) associated with each of the selected test device. Optimization process 260 further includes step 266 in which the calculated values of the physical quantitie(s) associated with each of the selected test device are compared with corresponding measurement data from the selected test devices using a linear least square fit routine. With the least square fit routine, at least some of the selected plurality of model parameters are optimized by minimizing a fitting error, such as error $\epsilon$ in the following equation:

$$\varepsilon = \sum_{i=1}^{N} \left( \frac{T^i_{mea} - T^i_{cal}}{T^i_{cal}} \right)^2,$$

where $T^i_{mea}$ is the measured value of a physical quantity for the $i^{th}$ test device, $T^i_{cal}$ is the calculated value of the physical quantity for the $i^{th}$ test device, and summation runs through the selected test devices. Step 266 determines an increment value for each of the model parameters being optimized. Optimization process 260 then determines at step 268 whether the increment values for the model parameters meet predetermined criteria, e.g., whether the increment value for a parameter is small enough. If it is, the initial guess of the value of the parameter is the final extracted parameter value. If the increment is not small enough, the initial guess of the model parameter is adjusted by adding to it the increment value for the model parameter, and the optimization process returns to step 264 and continues until the criteria are met.

Figure 2D:
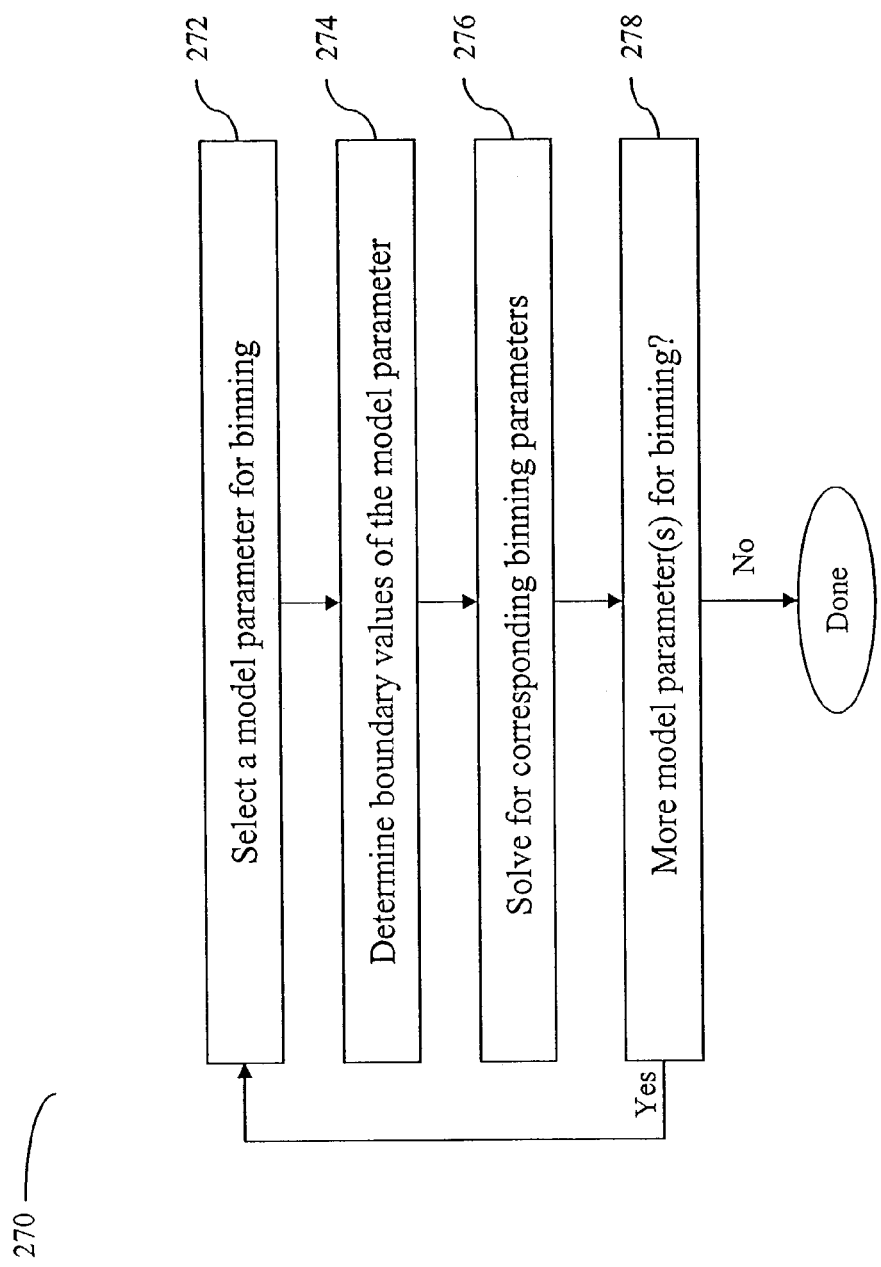
FIG. 2D is a flowchart illustrating a method for generating binning models according to one embodiment of the present invention.

When generating a regional global model for a G-type subregion, local optimization instead of global optimization should be used. During the local optimization, the model parameters are extracted by fitting current or capacitance values calculated form model equations to corresponding measurement data taken from devices having geometries within or on the borders of the G-type subregion. Thus, the measurement data used in the linear least square fit routine in step 266 only includes measurement data taken from test devices within or on the borders of the G-type subregion After the regional global models are generated, as shown in FIG. 2A, process 200 in one embodiment of the present invention proceeds to step 240 in which a binning model for each of the B-type subregions is generated. FIG. 2D illustrates a binning method 270 used in step 240 to generate a binning model card for a B-type subregion. As shown in FIG. 2D, the binning method 270 includes step 272 in which a model parameter is selected among a plurality of model parameters that can be binned. Examples of binnable model parameters for the BSIMPD model include Vth0, U0, A0, etc. Binning method 270 further includes step 274 in which one or more boundary values of the selected model parameter is determined using one or more regional global model cards associated with one or more G-type subregions adjacent the B-type subregion. In the example shown in FIG. 3C, when generating a binning model for the B-type subregion 320, the boundary values of a binnable parameter P are the values of the parameter P in the G-type subregions 310 and 330. In the example shown in FIG. 3D, the boundary values of P for the B-type subregion 351 are the values of P in the G-type subregions 342 and 344, the boundary values of P for the B-type subregion 353 are the values of P in the G-type subregions 344 and 346, the boundary values of P for the B-type subregion 355 are the values of P in the G-type subregions 342, 344, 346 and 348, the boundary values of P for the B-type subregion 357 are the values of P in the G-type subregions 344 and 348, and the boundary values of P for the B-type subregion 359 are the values of P in the G-type subregions 346 and 348.

Binning method 270 further includes step 276 in which one or more binning model parameters associated with the selected model parameter are determined. In one embodiment of the present invention, the selected model parameter is written as a function of device geometry instances in the B-type subregion. The function includes the one or more binning parameters as coefficients in the function. The binning parameters are then determined by solving one or more equations, which are obtained by equating the selected model parameter to the one or more boundary values at the boundaries of the B-type subregion.

For example, when the device geometrical space 300 is divided into G-type subregions 310 and 330, and B-type subregion 320, as shown in FIG. 3C, a model parameter P in the B-type subregion 320 can be written as:

$$P = P_0 + \frac{P_W}{W}$$

where $P_0$ and $P_W$ are binning parameters associated with model parameter P, and W stands for the drawn channel width. Suppose that the value of the model parameter P in the regional global model for the G-type subregion 310 is P' and the value of the model parameter P in the regional global model for the G-type subregion 330 is P'', binning parameters $P_0$ and $P_W$ can be determined by solving the following equations:

$$P_0 + \frac{P_W}{W_2} = P', \text{ and } P_0 + \frac{P_W}{W_3} = P'',$$

so that $$P_0 = \frac{W_2 P'' - W_3 P'}{W_2 - W_3}, \text{ and } P_W = W_2 W_3 \frac{P'' - P'}{W_2 - W_3}.$$

This way, the parameter P is continuous when device width is varied across the boundary between G-type region 310 and B-type region 320 and across the boundary between B-type region 320 and P-type region 330.

Alternatively, when the device geometrical space 300 is divided as shown in FIG. 3D, a model parameter P in the B-type subregion 355 can be written as:

$$P = P_0 + \frac{P_W}{W} + \frac{P_L}{L} + \frac{P_P}{W \times L}$$

where $P_0$, $P_W$, $P_L$, and $P_P$ are binning parameters associated with model parameter P, W stands for the drawn channel width and L stands for the drawn channel length. Suppose that the values of the model parameter P in the regional global models for the G-type subregions 342, 344, 246, and 348 are $P_1$, $P_2$, $P_3$, and $P_4$, respectively, binning parameters $P_0$ $P_W$, $P_L$, and $P_P$ can be determined by solving the following equations:

$$P_1 = P_0 + \frac{P_W}{W_2} + \frac{P_L}{L_2} + \frac{P_P}{W_2 \times L_2},$$

$$P_2 = P_0 + \frac{P_W}{W_2} + \frac{P_L}{L_3} + \frac{P_P}{W_2 \times L_3},$$

$$P_3 = P_0 + \frac{P_W}{W_3} + \frac{P_L}{L_2} + \frac{P_P}{W_3 \times L_2}, \text{ and}$$

$$P_4 = P_0 + \frac{P_W}{W_3} + \frac{P_L}{L_3} + \frac{P_P}{W_3 \times L_3}.$$

With $P_0$, $P_W$, $P_L$, and $P_P$ solved, the model parameter P in the B-type subregion 351 can be written as:

$$P = P_0 + \frac{P_W}{W_2} + \frac{P_L}{L} + \frac{P_P}{W_2 \times L};$$

the model parameter P in the B-type subregion 353 can be written as:

$$P = P_0 + \frac{P_W}{W} + \frac{P_L}{L_2} + \frac{P_P}{W \times L_2};$$

the model parameter P in the B-type subregion 357 can be written as:

$$P = P_0 + \frac{P_W}{W} + \frac{P_L}{L_3} + \frac{P_P}{W \times L_3};$$

and the model parameter P in the B-type subregion 359 can be written as:

$$P = P_0 + \frac{P_W}{W_3} + \frac{P_L}{L} + \frac{P_P}{W_3 \times L}.$$

This way, the parameter P is continuous when device width is varied from any subregion to any other subregion in the geometrical space 300. Thus, the method in one embodiment of the present invention combines the advantages of global models and binning models. In one aspect, the method in one embodiment of the present invention attains the advantage of accuracy associated with binning models by dividing the device geometrical space into subregions and by generating a separate model for each subregion. In another aspect, the method in one embodiment of the present invention provides prediction capabilities associated with global models in device geometry subregions for which global models are generated.

The forgoing descriptions of specific embodiments of the present invention are presented for purpose of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of the steps in the method are not necessarily intended to occur in the sequence laid out. It is intended that the scope of the invention be defined by the following claims and their equivalents.

APPENDIX A

MODEL PARAMETER LIST

| Symbol used in equation | Symbol used in Simulator | Description | Unit | Default | Notes (below the table) |
|---|---|---|---|---|---|
| | | MODEL CONTROL PARAMETERS | | | |
| None | level | Level 9 for BSIM3SOI | — | 9 | — |
| Shmod | shMod | Flag for self-heating 0 - no self-heating, 1 - self-heating | — | 0 | |
| Mobmod | mobmod | Mobility model selector | — | 1 | — |
| Capmod | capmod | Flag for the short channel capacitance model | — | 2 | nI-1 |
| Noimod | noimod | Flag for Noise model | — | 1 | — |
| | | PROCESS PARAMETERS | | | |
| $t_{si}$ | Tsi | Silicon film thickness | m | $10^{-7}$ | — |
| $t_{box}$ | Tbox | Buried oxide thickness | m | $3 \times 10^{-7}$ | — |
| $T_{ox}$ | Tox | Gate oxide thickness | m | $1 \times 10^{-8}$ | — |
| $X_j$ | Xj | S/D junction depth | m | nI-2 | — |
| $n_{ch}$ | Nch | Channel doping concentration | $1/cm^3$ | $1.7 \times 10^{17}$ | — |
| $n_{sub}$ | Nsub | Substrate doping concentration | $1/cm^3$ | $6 \times 10^{16}$ | nI-3 |
| Ngate | ngate | poly gate doping concentration | $1/cm^3$ | 0 | — |
| | | DC PARAMETERS | | | |
| $V_{th0}$ | vth0 | Threshold voltage @Vbs = 0 for long and wide device | — | 0.7 | — |
| $K_1$ | k1 | First order body effect coefficient | $V^{1/2}$ | 0.6 | — |
| $K_{1w1}$ | k1w1 | First body effect width dependent parameter | m | 0 | — |
| $K_{1w2}$ | k1w2 | Second body effect width dependent parameter | m | 0 | — |
| $K_2$ | k2 | Second order body effect coefficient | — | 0 | — |
| $K_3$ | k3 | Narrow width coefficient | — | 0 | — |
| $K_{3b}$ | k3b | Body effect coefficient of k3 | 1/V | 0 | — |
| $K_{b1}$ | Kb1 | Backgate body charge coefficient | — | 1 | — |
| $W_0$ | w0 | Narrow width parameter | m | 0 | — |
| $N_{LX}$ | nlx | Lateral non-uniform doping parameter | m | 1.74e-7 | — |
| $D_{vt0}$ | Dvt0 | first coefficient of short-channel effect on Vth | — | 2.2 | — |
| $D_{vt1}$ | dvt1 | Second coefficient of short-channel effect on Vth | — | 0.53 | — |
| $D_{vt2}$ | dvt2 | Body-bias coefficient of short-channel effect on Vth | 1/V | −0.032 | — |
| $D_{vt0w}$ | dvt0w | first coefficient of narrow width effect on Vth for small channel length | — | 0 | — |
| $D_{vt1w}$ | dvt1w | Second coefficient of narrow width effect on Vth for small channel length | — | 5.3e6 | — |
| $D_{vt2w}$ | dvt2w | Body-bias coefficient of narrow width effect on Vth for small channel length | 1/V | −0.032 | — |

APPENDIX A-continued

MODEL PARAMETER LIST

| Symbol | Name | Description | Unit | Value | |
|---|---|---|---|---|---|
| $\mu_0$ | u0 | Mobility at Temp = Tnom NMOSFET PMOSFET | cm$^2$/(V-sec) | 670 250 | — |
| $U_a$ | ua | First-order mobility degradation coefficient | m/V | 2.25e−9 | — |
| $U_b$ | ub | Second-order mobility degradation coefficient | (m/V)$^2$ | 5.9e−19 | — |
| $U_c$ | uc | Body-effect of mobility degradation coefficient | 1/V | −.0465 | — |
| $v_{sat}$ | vsat | Saturation velocity at Temp = Tnom | m/sec | 8e4 | — |
| A0 | a0 | Bulk charge effect coefficient for channel length | — | 1.0 | — |
| $A_{gs}$ | ags | Gate bias coefficient of $A_{bulk}$ | 1/V | 0.0 | — |
| B0 | b0 | Bulk charge effect coefficient for channel width | m | 0.0 | — |
| B1 | b1 | Bulk charge effect width offset | m | 0.0 | — |
| Keta | keta | Body-bias coefficient of bulk charge effect | V$^{-1}$ | 0 | — |
| Ketas | Ketas | Surface potential adjustment for bulk charge effect | V | 0 | — |
| $A_1$ | A1 | First non-saturation effect parameter | 1/V | 0.0 | — |
| $A_2$ | A2 | Second non-saturation effect parameter | 0 | 1.0 | — |
| $R_{dsw}$ | rdsw | Parasitic resistance per unit width | Ω-μm$^{Wr}$ | 100 | — |
| Prwb | prwb | Body effect coefficient of Rdsw | 1/V | 0 | — |
| Prwg | prwg | Gate bias effect coefficient of Rdsw | 1/V$^{1/2}$ | 0 | — |
| Wr | wr | Width offset from Weff for Rds calculation | — | 1 | — |
| Nfactor | nfactor | Subthreshold swing factor | — | 1 | — |
| Wint | wint | Width offset fitting parameter from I–V without bias | m | 0.0 | — |
| Lint | lint | Length offset fitting parameter from I–V without bias | m | 0.0 | — |
| DWg | dwg | Coefficient of Weff'S gate dependence | m/V | 0.0 | — |
| DWb | dwb | Coefficient of Weff'S substrate body bias dependence | m/V$^{1/2}$ | 0.0 | — |
| DWbc | Dwbc | Width offset for body contact isolation edge | m | 0.0 | — |
| $V_{off}$ | voff | Offset voltage in the subthreshold region for large W and L | V | −0.08 | — |
| Eta0 | eta0 | DIBL coefficient in subthreshold region | — | 0.08 | — |
| Etab | etab | Body-bias coefficient for the subthreshold DIBL effect | 1/V | −0.07 | — |
| $D_{sub}$ | dsub | DIBL coefficient exponent | — | 0.56 | — |
| $C_{it}$ | cit | Interface trap capacitance | F/m$^2$ | 0.0 | — |
| $C_{dsc}$ | cdsc | Drain/Source to channel coupling capacitance | F/m$^2$ | 2.4e−4 | — |
| $C_{dscb}$ | cdscb | Body-bias sensitivty of $C_{dsc}$ | F/m$^2$ | 0 | — |
| $C_{dscd}$ | cdscd | Drain-bias sensitivty of $C_{dsc}$ | F/m | 0 | — |
| $P_{clm}$ | pclm | Channel length modulation parameter | — | 1.3 | — |
| $P_{dibl1}$ | pdibl1 | First output resistance DIBL effect correction parameter | — | .39 | — |
| $P_{dibl2}$ | pdibl2 | Second output resistance DIBL effect correction parameter | — | 0.086 | — |
| $D_{rout}$ | drout | L dependence coefficient of the DIBL correction parameter in Rout | — | 0.56 | — |
| Pvag | pvag | Gate dependence of Early voltage | — | 0.0 | — |
| δ | delta | Effective $V_{ds}$ parameter | — | 0.01 | — |
| $\alpha_0$ | alpha0 | The first parameter of impact ionization current | m/V | 0.0 | — |
| $F_{bjtii}$ | fbjtii | Fraction of bipolar current affecting the impact ionization | — | 0.0 | — |
| $\beta_0$ | beta0 | First $V_{ds}$ dependent parameter of impact ionization current | V$^{-1}$ | 0 | — |
| $\beta_1$ | beta1 | Second $V_{ds}$ dependent parameter of impact ionization current | — | 0 | — |
| $\beta_2$ | beta2 | Third $V_{ds}$ dependent parameter of impact ionization current | V | 0.1 | — |
| $V_{dsatii0}$ | vdsatii0 | Nominal drain saturation voltage at threshold for impact ionization current | V | 0.9 | — |
| $T_{ii}$ | tii | Temperature dependent parameter for impact ionization current | — | 0 | — |

APPENDIX A-continued

MODEL PARAMETER LIST

| Symbol | SPICE | Description | Unit | Default | Notes |
|---|---|---|---|---|---|
| $L_{ii}$ | lii | Channel length dependent parameter at threshold for impact ionization current | — | 0 | — |
| $E_{satii}$ | esatii | Saturation channel electric field for impact ionization current | V/m | 1e7 | — |
| $S_{ii0}$ | sij0 | First $V_{gs}$ dependent parameter for impact ionization current | $V^{-1}$ | 0.5 | — |
| Sii1 | sii1 | Second $V_{gs}$ dependent parameter for impact ionization current | $V^{-1}$ | 0.1 | — |
| Sii2 | sii2 | Third $V_{gs}$ dependent parameter for impact ionization current | $V^{-1}$ | 0 | — |
| $S_{iid}$ | siid | dependent parameter of drain saturation voltage for impact ionization current | $V^{-1}$ | 0 | — |
| $\alpha_{gidl}$ | Agidl | GIDL constant | $\Omega^{-1}$ | 0.0 | — |
| $\beta_{gidl}$ | Bgidl | GIDL exponential coefficient | V/m | 0.0 | — |
| $\chi$ | Ngidl | GIDL $V_{ds}$ enhancement coefficient | V | 1.2 | — |
| $n_{tun}$ | Ntun | Reverse tunneling non-ideality factor | — | 10.0 | — |
| $n_{diode}$ | Ndio | Diode non-ideality factor | — | 1.0 | — |
| $n_{recf0}$ | Nrecf0 | Recombination non-ideality factor at forward bias | — | 2.0 | — |
| $n_{recr0}$ | Nrecr0 | Recombination non-ideality factor at reversed bias | — | 10 | — |
| $i_{sbjt}$ | Isbjt | BJT injection saturation current | A/m$^2$ | 1e-6 | — |
| $i_{sdif}$ | Isdif | Body to source/drain injection saturation current | A/m$^2$ | 1e-7 | — |
| $i_{srec}$ | Isrec | Recombination in depletion saturation current | A/m$^2$ | 1e-5 | — |
| $i_{stun}$ | Istun | Reverse tunneling saturation current | A/m$^2$ | 0.0 | — |
| Ln | Ln | Electron/hole diffusion length | m | 2e-6 | — |
| $V_{rec0}$ | Vrec0 | Voltage dependent parameter for recombination current | V | 0 | — |
| $V_{tun0}$ | Vtun0 | Voltage dependent parameter for tunneling current | V | 0 | — |
| $N_{bjt}$ | Nbjt | Power coefficient of channel length dependency for bipolar current | — | 1 | — |
| $L_{bjt0}$ | Lbjt0 | Reference channel length for bipolar current | m | 0.20e-6 | — |
| $V_{abjt}$ | Vabjt | Early voltage for bipolar current | V | 10 | — |
| $A_{ely}$ | Aely | Channel length dependency of early voltage for bipolar current | V/m | 0 | — |
| $A_{hli}$ | Ahli | High level injection parameter for bipolar current | — | 0 | — |
| Rbody | Rbody | Intrinsic body contact sheet resistance | ohm/m$^2$ | 0.0 | — |
| Rbsh | Rbsh | Extrinsic body contact sheet resistance | ohm/m$^2$ | 0.0 | — |
| Rsh | rsh | Source drain sheet resistance in ohm per square | $\Omega$/square | 0.0 | — |

| Symbol used in equation | Symbol used in SPICE | Description | Unit | Default | Notes (below the table) |
|---|---|---|---|---|---|

AC AND CAPACITANCE PARAMETERS

| | | | | | |
|---|---|---|---|---|---|
| Xpart | xpart | Charge partitioning rate flag | — | 0 | — |
| CGSO | cgso | Non LDD region source-gate overlap capacitance per channel length | F/m | calculated | nC-1 |
| CGDO | cgdo | Non LDD region drain-gate overlap capacitance per channel length | F/m | calculated | nC-2 |
| CGEO | cgeo | Gate substrate overlap capacitance per unit channel length | F/m | 0.0 | — |
| Cjswg | cjswg | Source/Drain (gate side) sidewall junction capacitance per unit width (normalized to 100 nm $T_{si}$) | F/m$^2$ | $1e^{-10}$ | — |
| Pbswg | pbswg | Source/Drain (gate side) sidewall junction capacitance buit in potential | V | .7 | — |

APPENDIX A-continued

MODEL PARAMETER LIST

| Symbol used in equation | Symbol used in Simulator | Description | Unit | Default | Notes (below the table) |
|---|---|---|---|---|---|
| \multicolumn{6}{c}{AC AND CAPACITANCE PARAMETERS} | | | | | |
| $M_{jswg}$ | mjswg | Source/Drain (gate side) sidewall junction capacitance grading coefficient | V | 0.5 | — |
| $t_t$ | tt | Diffusion capacitance transit time coefficient | second | 1ps | — |
| $N_{dif}$ | Ndif | Power coefficient of channel length dependency for diffusion capacitance | — | 1 | — |
| $L_{dif0}$ | Ldif0 | Channel-length dependency coefficient of diffusion cap. | — | 1 | — |
| $V_{sdfb}$ | vsdfb | Source/drain bottom diffusion capacitance flatband voltage | V | calculated | nC-3 |
| $V_{sdth}$ | vsdth | Source/drain bottom diffusion capacitance threshold voltage | V | calculated | nC-4 |
| $C_{sdmin}$ | csdmin | Source/drain bottom diffusion minimum capacitance | V | calculated | nC-5 |
| $A_{sd}$ | asd | Source/drain bottom diffusion smoothing parameter | — | 0.3 | — |
| $C_{sdesw}$ | csdesw | Source/drain sidewall fringing capacitance per unit length | F/m | 0.0 | — |
| CGSl | cgsl | Light doped source-gate region overlap capacitance | F/m | 0.0 | — |
| CGDl | cgdl | Light doped drain-gate region overlap capacitance | F/m | 0.0 | — |
| CKAPPA | ckappa | Coefficient for lightly doped region overlap capacitance fringing field capacitance | F/m | 0.6 | — |
| Cf | cf | Gate to source/drain fringing field capacitance | F/m | calculated | nC-6 |
| CLC | clc | Constant term for the short channel model | m | 0.1 ×10⁻⁷ | — |
| CLE | cle | Exponential term for the short channel model | none | 0.0 | — |
| DLC | dlc | Length offset fitting parameter for gate charge | m | lint | — |
| DLCB | dlcb | Length offset fitting parameter for body charge | m | lint | — |
| DLBG | dlbg | Length offset fitting parameter for backgate charge | m | 0.0 | — |
| DWC | dwc | Width offset fitting parameter from C-V | m | wint | — |
| DelVt | delvt | Threshold voltage adjust for C-V | V | 0.0 | — |
| $F_{body}$ | fbody | Scaling factor for body charge | — | 1.0 | — |
| acde | acde | Exponential coefficient for charge thickness in capMod = 3 for accumulation and depletion regions. | m/V | 1.0 | — |
| moin | moin | Coefficient for the gate-bias dependent surface potential. | $V^{1/2}$ | 15.0 | — |

| Symbol used in equation | Symbol used in Simulator | Description | Unit | Default | Notes |
|---|---|---|---|---|---|
| \multicolumn{6}{c}{TEMPERATURE PARAMETERS} | | | | | |
| Tnom | tnom | Temperature at which parameters are expected | ° C. | 27 | — |
| µte | ute | Mobility temperature exponent | none | −1.5 | — |
| Kt1 | kt1 | Temperature coefficient for threshold voltage | V | −0.11 | — |
| Kt11 | kt11 | Channel length dependence of the temperature coefficient for threshold voltage | V * m | 0.0 | — |
| Kt2 | kt2 | Body-bias coefficient of the Vth temperature effect | none | 0.022 | — |
| Ua1 | ua1 | Temperature coefficient for $U_a$ | m/V | 4.31e−9 | — |
| Ub2 | ub1 | Temperature coefficient for $U_b$ | $(m/V)^2$ | −7.61e−18 | — |
| Uc1 | uc1 | Temperature coefficient for Uc | 1/V | −.056 | nT-1 |
| At | at | Temperature coefficient for saturation velocity | m/sec | 3.3e4 | — |
| Tcijswg | tcjswg | Temperature coefficient of $C_{jswg}$ | 1/K | 0 | — |
| Tpbswg | tpbswg | Temperature coefficient of $P_{bswg}$ | V/K | 0 | — |
| cth0 | cth0 | Normalized thermal capacity | m° C./(W * sec) | 0 | — |
| Prt | prt | Temperature coefficient for Rdsw | Ω-µm | 0 | — |
| Rth0 | rth0 | Normalized thermal resistance | m° C./W | 0 | — |
| $Nt_{recf}$ | Ntrecf | Temperature coefficient for $N_{recf}$ | — | 0 | — |
| $Nt_{recr}$ | Ntrecr | Temperature coefficient for $N_{recr}$ | — | 0 | — |
| $X_{bjt}$ | xbjt | Power dependence of $j_{bjt}$ on temperature | — | 2 | — |

APPENDIX A-continued

MODEL PARAMETER LIST

| | | | | | |
|---|---|---|---|---|---|
| $X_{dif}$ | xdif | Power dependence of $j_{dir}$ on temperature | — | 2 | — |
| $X_{rec}$ | xrec | Power dependence of $j_{rec}$ on temperature | — | 20 | — |
| $X_{tun}$ | xtun | Power dependence of $j_{tun}$ on temperature | — | 0 | — |

NOTES nI-1. BSJIMPD2.0 supports capmod = 2 and 3 only. Capmod = 0 and 1 are not supported.

nI-2. In modem SOI technology, source/drain extension or LDD are commonly used. As a result, the source/drain junction depth ($X_j$) can be different from the silicon film thickness ($T_{si}$). By default, if $X_j$ is not given, it is set to $T_{si}$. $X_j$ is not allowed to be greater than $T_{si}$.

nI-3. BSIMPD refers substrate to the silicon below buried oxide, not the well region in BSIM3. It is used to calculate backgate flatband voltage ($V_{fbb}$) and parameters related to source/drain diffusion bottom capacitance ($V_{sdth}$, $V_{sdfb}$, $C_{sdmin}$). Positive $n_{sub}$ means the same type of doping as the body and negative $n_{sub}$ means opposite type of doping.

nC-1. If cgso is not given then it is calculated using:
if (dlc is given and is greater 0) then,
    cgso = p1 = (dlc * cox) − cgs1
if (the previously calculated cgso < 0), then
    cgso = 0
else cgso = 0.6 * Tsi * cox nC-2. Cgdo is calculated in a way similar to Csdo nC-3. If ($n_{sub}$ is positive)

$$V_{sdfb} = -\frac{kT}{q}\log\left(\frac{10^{20} \cdot n_{sub}}{n_i \cdot n_i}\right) - 0.3$$

else $$V_{sdfb} = -\frac{kT}{q}\log\left(\frac{10^{20}}{n_{sub}}\right) + 0.3$$

nC-4. If ($n_{sub}$ is positive)

$$\phi_{sd} = 2\frac{kT}{q}\log\left(\frac{n_{sub}}{n_i}\right),\ \gamma_{sd} = \frac{5.753 \times 10^{-12}\sqrt{n_{sub}}}{C_{box}}$$

I. BSIMPD IV

1 Body Voltages $V_{bsh}$ is equal to the $V_{bs}$ bounded between ($V_{bsc}$, $\phi_{s1}$). $V_{bsh}$ is used in $V_{th}$ and $A_{bulk}$ calculation 1.1 $T1 = V_{bsc} + 0.5\left[V_{bs} - V_{bsc} - \delta + \sqrt{(V_{bs} - V_{bsc} - \delta)^2 - 4\delta V_{bsc}}\right]$, $V_{bsc} = -5$ V 1.2 $V_{bsh} = \phi_{s1} - 0.5\left[\phi_{s1} - T1 - \delta + \sqrt{(\phi_{s1} - T1 - \delta)^2 - 4\delta T_1}\right]$, $\phi_{s1} = 1.5$ $V_{bsh}$ is further limited to $0.95\phi_s$ to give $V_{bseff}$.

1.3 $V_{bseff} = \phi_{s0} - 0.5\left[\phi_{s0} - V_{bsh} - \delta + \sqrt{(\phi_{s0} - V_{bsh} - \delta)^2 + 4\delta V_{bsh}}\right]$, $\phi_{s0} = 0.95\phi_s$ 2. Effective Channel Length and Width 2.1 $dW' = W_{ln} + \dfrac{W_l}{L^{W_{ln}}} + \dfrac{W_w}{W^{W_{wn}}} + \dfrac{W_{wl}}{L^{W_{ln}} W^{W_{wn}}}$ 2.2 $dW = dW' + dW_g V_{gsteff} + dW_b\left(\sqrt{\Phi_x - V_{bseff}} - \sqrt{\Phi_x}\right)$ 2.3 $dL = L_{int} + \dfrac{L_l}{L^{L_{ln}}} + \dfrac{L_w}{W^{L_{wn}}} + \dfrac{L_{wl}}{L^{L_{ln}} W^{L_{wn}}}$ 2.4 $L_{eff} = L_{drawn} - 2dL$ 2.5 $W_{eff} = W_{drawn} - N_{bc}dW_{bc} - (2 - N_{bc})dW$ 2.6 $W'_{eff} = W_{drawn} - N_{bc}dW_{bc} - (2 - N_{bc})dW'$ 2.7 $W_{diod} = \dfrac{W'_{eff}}{N_{seg}} + P_{dbcp}$ 2.8 $W_{dias} = \dfrac{W'_{eff}}{N_{seg}} + P_{shcp}$ -continued 3. Threshold Voltage 3.1 $V_{th} = V_{tho} + K_{1eff}\left(sqrtPhisExt - \sqrt{\Phi_s}\right) - K_2 V_{bseff} + K_{1eff}\left(\sqrt{1 + \frac{N_{LX}}{L_{eff}}} - 1\right)\sqrt{\Phi_s} +$ $(K_3 + K_{3b}V_{bseff})\frac{T_{ox}}{W'_{eff} + W_o}\Phi_s - D_{VT0w}\left(\exp\left(-D_{VT1w}\frac{W'_{eff}L_{eff}}{2l_{tw}}\right) + 2\exp\left(-D_{VT1w}\frac{W'_{eff}L_{eff}}{l_{tw}}\right)\right)(V_{bi} - \Phi_s) -$ $D_{VT0}\left(\exp\left(-D_{VT1}\frac{L_{eff}}{2l_t}\right) + 2\exp\left(-D_{VT1}\frac{L_{eff}}{l_t}\right)\right)(V_{bi} - \Phi_s) - \left(\exp\left(-D_{sub}\frac{L_{eff}}{2l_{to}}\right) + 2\exp\left(-D_{sub}\frac{L_{eff}}{l_{to}}\right)\right)(E_{tao} + E_{sub}V_{bseff})V_{ds}$ 3.2 $l_t = \sqrt{\varepsilon_{si}X_{dep}/C_{ox}}\,(1 + D_{VT2}V_{besff})$ 3.3, 3.4 $sqrtPhisExt = \sqrt{\phi_s - V_{besff}} + s(V_{bsh} - V_{bseff}),\ s = -\frac{1}{2\sqrt{\phi_s - \phi_{s0}}}$ 3.5 $K_{1eff} = K_1\left(1 + \frac{K_{1w1}}{W'_{eff} + K_{1w2}}\right)$ 3.6, 3.7 $l_{tw} = \sqrt{\varepsilon_{si}X_{dep}/C_{ox}}\,(1 + D_{VT2w}V_{besff})\quad l_{to} = \sqrt{\varepsilon_{si}X_{dep0}/C_{ox}}$ 3.8, 3.9 $X_{dep} = \sqrt{\frac{2\varepsilon_{si}(\Phi_s - V_{besff})}{qN_{ch}}}\quad X_{dep0} = \sqrt{\frac{2\varepsilon_{si}\Phi_x}{qN_{ch}}}$ 3.10 $V_{bi} = v_t \ln\left(\frac{N_{ch}N_{DS}}{n_i^2}\right)$ 4. Polydepletion effect 4.1 $V_{poly} + \frac{1}{2}X_{poly}E_{poly} = \frac{qN_{gate}X_{poly}^2}{2\varepsilon_{si}}$ 4.2 $\varepsilon_{ox}E_{ox} = \varepsilon_{si}E_{poly} = \sqrt{2q\varepsilon_{si}N_{gate}V_{poly}}$ 4.3 $V_{gs} - V_{FB} - \phi_x = V_{poly} + V_{ox}$ 4.4 $a(V_{gs} - V_{FB} - \phi_s - V_{poly})^2 - V_{poly} = 0$ 4.5 $a = \frac{\varepsilon^2}{2q\varepsilon_{si}N_{gate}T_{ox}^2}$ 4.6 $V_{gs\_off} = V_{FB} + \phi_s + \frac{q\varepsilon_{si}N_{gate}T_{ox}^2}{\varepsilon_{ox}^2}\left[\sqrt{1 + \frac{2\varepsilon_{ox}^2(V_{gs} - V_{FB} - \phi_s)}{q\varepsilon_{si}N_{gate}T_{ox}^2}} - 1\right]$ 5. Effective $V_{gst}$ for all region (with Polysilicon Depletion Effect)

5.1 $V_{gsteff} = \dfrac{2nv_t\ln\left[1 + \exp\left(\dfrac{V_{gs\_eff} - V_{th}}{2nv_t}\right)\right]}{1 + 2nC_{ox}\sqrt{\dfrac{2\Phi_s}{q\varepsilon_{si}N_{ch}}}\exp\left(-\dfrac{V_{gs\_eff} - V_{th} - 2V_{off}}{2nv_t}\right)}$ 5.2 $n = 1 + N_{factor}\dfrac{\varepsilon_{si}/X_{dep}}{C_{ox}} + \dfrac{(C_{dsc} + C_{dscd}V_{ds} + C_{dsch}V_{bseff})\left[\exp\left(-D_{VT1}\dfrac{L_{eff}}{2l_t}\right) + 2\exp\left(-D_{VT1}\dfrac{L_{eff}}{l_t}\right)\right]}{C_{ox}} + \dfrac{C_{it}}{C_{ox}}$ 6. Effective Bulk Charge Factor 6.1 $A_{bulk} = 1 + \left(\dfrac{K_{1eff}}{2\sqrt{(\phi_s + Ketas) - \dfrac{V_{bsh}}{1 + Keta \cdot V_{bsh}}}}\left(\dfrac{A_0 L_{eff}}{L_{eff} + 2\sqrt{T_{si}X_{dep}}}\left(1 - A_{gs}V_{gsteff}\left(\dfrac{L_{eff}}{L_{eff} + 2\sqrt{T_{si}X_{dep}}}\right)^2\right) + \dfrac{B_0}{W'_{eff} + B_1}\right)\right)$ 6.2 $A_{bulk0} = A_{bulk}(V_{gsteff} = 0)$ 7. Mobility and Saturation Velocity 7.1 For $Mobmod = 1$ $\mu_{eff} = \dfrac{\mu_o}{1 + (U_a + U_c V_{bseff})\left(\dfrac{V_{gsteff} + 2V_{th}}{T_{ox}}\right) + U_b\left(\dfrac{V_{gsteff} + 2V_{th}}{T_{ox}}\right)^2}$ 7.2 For $Mobmod = 2$ $\mu_{eff} = \dfrac{\mu_o}{1 + (U_a + U_c V_{bseff})\left(\dfrac{V_{gsteff}}{T_{ox}}\right) + U_b\left(\dfrac{V_{gsteff}}{T_{ox}}\right)^2}$ -continued 7.3 For *Mobmod* = 3

$$\mu_{eff} = \frac{\mu_0}{1 + \left[U_a\left(\frac{V_{gsteff} + 2V_{th}}{T_{ox}}\right) + U_b\left(\frac{V_{gsteff} + 2V_{th}}{T_{ox}}\right)^2\right](1 + U_c V_{bseff})}$$

8. Drain Saturation Voltage 8.1 For $R_{ds} > 0$ or $\lambda \neq 1$:

8.1.a $V_{dsat} = \dfrac{-b - \sqrt{b^2 - 4ac}}{2a}$ 8.1.b $a = A_{bulk}^2 W_{eff} v_{sat} C_{ox} R_{ds} + \left(\dfrac{1}{\lambda} - 1\right) A_{bulk}$ 8.1.c $b = -\left[(V_{gsteff} + 2v_t)\left(\dfrac{2}{\lambda} - 1\right) + A_{bulk} E_{sat} L_{eff} + 3 A_{bulk} (V_{gsteff} + 2v_t) W_{eff} v_{sat} C_{ox} R_{ds}\right]$ 8.1.d $c = (V_{gsteff} + 2v_t) E_{sat} L_{eff} + 2(V_{gsteff} + 2v_t)^2 W_{eff} v_{sat} C_{ox} R_{ds}$ 8.1.e $\lambda = A_1 V_{gsteff} + A_2$ 8.2 For $R_{ds} = 0, \lambda = 1$:

8.2.a $V_{dsat} = \dfrac{E_{sat} L_{eff} (V_{gsteff} + 2v_t)}{A_{bulk} E_{sat} L_{eff} + (V_{gsteff} + 2v_t)}$ 8.2.b $E_{sat} = \dfrac{2 v_{sat}}{\mu_{eff}}$ 8.3 $V_{dseff}$ $V_{dseff} = V_{dsat} - \dfrac{1}{2}\left[V_{dsat} - V_{ds} - \delta + \sqrt{(V_{dsat} - V_{dt} - \delta)^2 + 4\delta V_{dsat}}\right]$ 9. Drain Current Expression 9.1 $I_{ds,MOSFET} = \dfrac{1}{N_{seg}} \dfrac{I_{ds0}(V_{dseff})}{1 + \dfrac{R_{ds} I_{dso}(V_{dseff})}{V_{dseff}}} \left(1 + \dfrac{V_{ds} - V_{dseff}}{V_A}\right)$ 9.2 $\beta = \mu_{eff} C_{ox} \dfrac{W_{eff}}{L_{eff}}$ 9.3 $I_{dso} = \dfrac{\beta V_{gsteff}\left(1 - A_{bulk}\dfrac{V_{dseff}}{2(V_{gsteff} + 2v_t)}\right) V_{dseff}}{1 + \dfrac{V_{dseff}}{E_{sat} L_{eff}}}$ 9.4 $V_A = V_{Asat} + \left(1 + \dfrac{P_{vag} V_{gsteff}}{E_{sat} L_{eff}}\right)\left(\dfrac{1}{V_{ACLM}} + \dfrac{1}{V_{ADIBLC}}\right)^{-1}$ 9.5 $V_{ACLM} = \dfrac{A_{bulk} E_{sat} L_{eff} + V_{gsteff}}{P_{clm} A_{bulk} E_{sat} litl}(V_{ds} - V_{dseff})$ 9.6 $V_{ADIBLC} = \dfrac{(V_{gsteff} + 2v_t)}{\theta_{rout}(1 + P_{DIBLCB} V_{bseff})}\left(1 - \dfrac{A_{bulk} V_{dsat}}{A_{bulk} V_{dsat} + 2v_t}\right)$ 9.7 $\theta_{rout} P_{DIBLC1}\left[\exp\left(-D_{ROUT}\dfrac{L_{eff}}{2 l_{t0}}\right) + 2\exp\left(-D_{ROUT}\dfrac{L_{eff}}{l_{t0}}\right)\right] + P_{DIBLC2}$ 9.8 $V_{Asat} = \dfrac{E_{sat} L_{eff} + V_{dsat} + 2 R_{ds} v_{sat} C_{ox} W_{eff} V_{gsteff}\left[1 - \dfrac{A_{bulk} V_{dsat}}{2(V_{gsteff} + 2v_t)}\right]}{2/\lambda - 1 + R_{ds} v_{sat} C_{ox} W_{eff} A_{bulk}}$ 9.9 $litl = \sqrt{\dfrac{\varepsilon_{si} T_{ox} T_{Si}}{\varepsilon_{ox}}}$ 9.10 $A_{bulk} = 1 + \left(\dfrac{K_{1eff}}{2\sqrt{(\phi_s + Ketas) - \dfrac{V_{bsh}}{1 + Keta \cdot V_{bsh}}}}\left(\dfrac{A_0 L_{eff}}{L_{eff} + 2\sqrt{T_{si} X_{dep}}}\left(1 - A_{gs} V_{gsteff}\left(\dfrac{L_{eff}}{L_{eff} + 2\sqrt{T_{si} X_{dep}}}\right)^2\right) + \dfrac{B_0}{W'_{eff} + B_1}\right)\right)$ 10. Drain/Source Resistance 10.1 $R_{ds} = R_{dsw}\dfrac{1 + P_{rwg} V_{gsteff} + P_{rwb}\left(\sqrt{\phi_s - V_{bseff}} - \sqrt{\phi_s}\right)}{(10^6 W'_{eff})^{Wr}}$ -continued 11. Impact Ionization Current 11.1 $I_{ii} = \alpha_0 (I_{ds,MOSFET} + F_{hjtii} I_c) \exp\left(\dfrac{V_{diff}}{\beta_2 + \beta_1 V_{diff} + \beta_0 V_{diff}^2}\right)$ 11.2 $V_{diff} = V_{ds} - V_{dsatii}$ 11.3 $V_{dsatii} = VgsStep + \left[V_{dsatii0}\left(1 + T_{ii}\left(\dfrac{T}{T_{nom}} - 1\right)\right)\dfrac{L_{ii}}{L_{eff}}\right]$ 11.4 $VgsStep = \left(\dfrac{E_{satii} L_{eff}}{1 + E_{satii} L_{eff}}\right)\left(\dfrac{1}{1 + S_{ii1} V_{gsteff}} + S_{ii2}\right)\left(\dfrac{S_{ii0} V_{gst}}{1 + S_{iid} V_{ds}}\right)$ 12. Gate-induced-Drain-Leakage (GIDL)

12.1 At drain, $I_{dgidl} = W_{diod} \alpha_{gidl} E_s \exp\left(-\dfrac{\beta_{gidl}}{E_s}\right)$, $E_s = \dfrac{V_{ds} - V_{gs} - \chi}{3 T_{ox}}$ 12.2 At source, $I_{sgidl} = W_{dios} \alpha_{gidl} E_s \exp\left(-\dfrac{\beta_{gidl}}{E_s}\right)$, $E_s = \dfrac{-V_{gs} - \chi}{3 T_{ox}}$ If $E_s$ is negative, $I_{gidl}$ is set to zero for both drain and source.

13. Body Contact Current 13.1 $R_{bp} = R_{body0} \dfrac{W'_{eff} / N_{seg}}{L_{eff}}$, $R_{bodyext} = R_{bsh} N_{rb}$ 13.2 For $4-T$ device, $I_{bp} = 0$ 13.3 For $5-T$ device, $I_{bp} = \dfrac{V_{bp}}{R_{bp} + R_{bodytext}}$ 14. Diode and BJT currents 14.1 Bipolar Transport Factor $\alpha_{bjt} = \exp\left[-0.5\left(\dfrac{L_{eff}}{L_n}\right)^2\right]$ 14.2 Body-to-source/drain diffusion 14.2.a $I_{bs1} = W_{dios} T_{si} j_{sdif} \left(\exp\left(\dfrac{V_{bs}}{n_{dio} V_t}\right) - 1\right)$ 14.2.b $I_{bd1} = W_{diod} T_{si} j_{sdif} \left(\exp\left(\dfrac{V_{bd}}{n_{dio} V_t}\right) - 1\right)$ 14.3. Recombination/trap-assist tunneling current in depletion region 14.3.a $I_{bs2} = W_{dios} T_{si} j_{srec} \left(\exp\left(\dfrac{V_{bs}}{0.026 \, n_{recf}}\right) - \exp\left(\dfrac{V_{sb}}{0.026 \, n_{recr}} \dfrac{V_{rec0}}{V_{rec0} + V_{sb}}\right)\right)$ 14.3.b $I_{bd2} = W_{diod} T_{si} j_{srec} \left(\exp\left(\dfrac{V_{bd}}{0.026 \, n_{recf}}\right) - \exp\left(\dfrac{V_{db}}{0.026 \, n_{recr}} \dfrac{V_{rec0}}{V_{rec0} + V_{db}}\right)\right)$ 14.4 Reverse bias tunneling leakage 14.4.a $I_{bs4} = W_{dios} T_{si} j_{stun} \left(1 - \exp\left(\dfrac{n_{tun} V_{sb}}{V_{tun0} + V_{sb}}\right)\right)$ 14.4.b $I_{bd4} = W_{diod} T_{si} j_{stun} \left(1 - \exp\left(\dfrac{n_{tun} V_{db}}{V_{tun0} + V_{db}}\right)\right)$ 14.5. Recombination current in neutral body 14.5.a $I_{bs3} = (1 - \alpha_{bjt}) I_{en} \left[\exp\left(\dfrac{V_{bs}}{n_{dio} V_t}\right) - 1\right] \dfrac{1}{\sqrt{E_{hlis} + 1}}$ 14.5.b $I_{bd3} = (1 - \alpha_{bjt}) I_{en} \left[\exp\left(\dfrac{V_{bd}}{n_{dio} V_t}\right) - 1\right] \dfrac{1}{\sqrt{E_{hlid} + 1}}$ 14.5.c $I_{en} = \dfrac{W'_{eff}}{N_{seg}} T_{si} j_{sbjt} \left[L_{bjt}\left(\dfrac{1}{L_{eff}} + \dfrac{1}{L_n}\right)\right]^{N_{bjt}}$ 14.5.d $E_{hlis} = A_{\text{hli\_eff}} \left[\exp\left(\dfrac{V_{bs}}{n_{dio} V_t}\right) - 1\right]$ 14.5.e $E_{hlid} = A_{\text{hli\_eff}} \left[\exp\left(\dfrac{V_{bd}}{n_{dio} V_t}\right) - 1\right]$ 14.5.f $A_{\text{hli\_eff}} = A_{\text{hli}} \exp\left[\dfrac{-E_g(300K)}{n_{dio} V_t} X_{bjt}\left(1 - \dfrac{T}{T_{nom}}\right)\right]$ 14.6 BJT collector current -continued 14.6a $I_c = \alpha_{bjt} I_{en} \left\{ \exp\left[\frac{V_{bs}}{n_{dio} V_t}\right] - \exp\left[\frac{V_{bd}}{n_{dio} V_t}\right] \right\} \frac{1}{E_{2nd}}$ 14.6b $E_{2nd} = \frac{E_{ely} + \sqrt{E_{ely}^2 + 4E_{hli}}}{2}$ 14.6c $E_{ely} = 1 + \frac{V_{bx} + V_{bd}}{V_{Abit} + A_{ely} L_{eff}}$ 14.6d $E_{hli} = E_{hlis} + E_{hlio}$ 14.7 Total body-source/drain current 14.7a $I_{bs} = I_{bs1} + I_{bs2} + I_{bs3} + I_{bs4}$ 14.7b $I_{bd} = I_{bd1} + I_{bd2} + I_{bd3} + I_{bd4}$ 15. Total Body Current 15.1 $I_{ii} + I_{dgidl} + I_{sgidl} - I_{bs} - I_{bd} - I_{bp} = 0$ 16. Temperature Effects 16.1 $V_{th(T)} = V_{th(nom)} + (K_{T1} + K_{tNl}/L_{eff} + K_{T2} V_{bseff})(T/T_{nom} - 1)$ 16.2 $\mu_{o(T)} = \mu_{o(Tnom)} \left(\frac{T}{T_{nom}}\right)^{\mu ic}$, $v_{sat(T)} = v_{sat(Tnom)} - A_T(T/T_{nom} - 1)$ 16.3 $R_{dsw(T)} = R_{dsw(nom)} T + P_{rt}\left(\frac{T}{T_{nom}} - 1\right)$ 16.4 $U_{a(T)} = U_{a(Tnom)} + U_{a1}(T/T_{nom} - 1)$ 16.5 $U_{b(T)} = U_{b(Tnom)} + U_{b1}(T/T_{nom} - 1)$ 16.6 $U_{c(T)} = U_{c(Tnom)} + U_{c1}(T/T_{nom} - 1)$ 16.7 $R_{th} = \frac{R_{th0}}{W'_{eff}/N_{seg}}$, $C_{th} = C_{th0} \frac{W'_{eff}}{N_{seg}}$ 16.8 $j_{sbjt} = j_{sbjt0} \exp\left[\frac{-E_g(300K)}{n_{dio} V_t} X_{bjt}\left(1 - \frac{T}{T_{nom}}\right)\right]$ 16.9 $j_{sdif} = j_{sdif0} \exp\left[\frac{-E_g(300K)}{n_{dio} V_t} X_{bjt}\left(1 - \frac{T}{T_{nom}}\right)\right]$ 16.10 $j_{srec} = j_{srec0} \exp\left[\frac{-E_g(300K)}{n_{recf0} V_t} X_{rec}\left(1 - \frac{T}{T_{nom}}\right)\right]$ 16.11 $j_{stun} = j_{stun0} \exp\left[X_{tun}\left(\frac{T}{T_{nom}} - 1\right)\right]$ 16.12 $n_{recf} = n_{recf0}\left[1 + nt_{recf}\left(\frac{T}{T_{nm}} - 1\right)\right]$ 16.13 $n_{recr} = n_{recr0}\left[1 + nt_{recr}\left(\frac{T}{T_{nm}} - 1\right)\right]$ $E_g$ is the energy gap energy.

17. Oxide Tunneling Current 17.1 In inversion, 17.1.a. $J_{gb} = A \frac{V_{gb} V_{aux}}{T_{ox}^2} \left[\frac{T_{oxref}}{T_{oxqm}}\right]^{Ntun} \exp\left[\frac{-B(\alpha_{gb1} - \beta_{gb1}|V_{ox}|)T_{ox}}{1 - |V_{ox}|/V_{gb1}}\right]$ 17.1.b. $V_{aux} = V_{EVB} \ln\left[1 + \exp\left(\frac{|V_{ox}| - \varphi_g}{V_{EVB}}\right)\right]$ 17.1.c. $A = \frac{q^3}{8\pi h \phi_b}$ 17.1.d. $B = \frac{8\pi \sqrt{2m_{ox}} \phi_b^{3/2}}{3hq}$ 17.1.e. $\phi_b = 4.2 eV$ 17.1.f. $m_{ox} = 0.3 m_0$ 17.2. In accumulation, 17.2a. $J_{gb} = A\dfrac{V_{gb}V_{aux}}{T_{ox}^2}\left[\dfrac{T_{oxref}}{T_{oxqm}}\right]^{N_{tun}} \exp\left[\dfrac{-B(\alpha_{gb2} - \beta_{gb2}|V_{ox}|)T_{ox}}{1 - |V_{ox}|/V_{gb2}}\right]$ 17.1.b. $V_{aux} = V_{ECB}V_t \ln\left[1 + \exp\left(-\dfrac{V_{gb} - V_{fb}}{V_{ECB}}\right)\right]$ 17.1.c. $A = \dfrac{q^3}{8\pi h \phi_b}$ 17.1.d. $B = \dfrac{8\pi\sqrt{2m_{ox}}\,\phi_b^{3/2}}{3hq}$ 17.1.e. $\phi_b = 3.1 eV$ 17.1.f. $m_{ox} = 0.4\, m_0$

II. BSIMPD CV

18. Dimension Dependence 18.1 $\delta W_{eff} = DWC + \dfrac{W_{lc}}{L^{W_{1a}}} + \dfrac{W_{wc}}{W^{W_{ww}}} + \dfrac{W_{wlc}}{L^{W_{1n}}W^{W_{ww}}}$ 18.2 $\delta L_{eff} = DLC + \dfrac{L_{lc}}{L^{L_{1a}}} + \dfrac{L_{wc}}{W^{L_{ww}}} + \dfrac{L_{wlc}}{L^{L_{1n}}W^{L_{ww}}}$ 18.3 $L_{active} = L_{drawn} - 2\delta L_{eff}$ 18.4 $L_{activeB} = L_{active} - DLCB$ 18.5 $L_{activeBG} = L_{activeB} + 2\delta L_{bg}$ 18.6 $W_{active} = W_{drawn} - N_{bc}dW_{bc} - (2 - N_{bc})\delta W_{eff}$ 18.7 $W_{diosCV} = \dfrac{W_{active}}{N_{seg}} + P_{sbcp}$ 18.8 $W_{diodCV} = \dfrac{W_{active}}{N_{seg}} + P_{dbcp}$

19. Charge Conservation 19.1 $Q_{Bf} = Q_{acc} + Q_{sub0} + Q_{subs}$ 19.2 $Q_{inv} = Q_{inv,s} + Q_{inv,d}$ 19.3 $Q_g = -(Q_{inv} + Q_{Bf})$ 19.4 $Q_b = Q_{Bf} - Q_c + Q_{js} + Q_{jd}$ 19.5 $Q_s = Q_{inv,s} - Q_{js}$ 19.6 $Q_d = Q_{inv,d} - Q_{jd}$ 19.7 $Q_g + Q_c + Q_b + Q_s + Q_d = 0$

20 Intrinsic Charges 20.1 (1)$capMod = 2$ 20.1.a Front Gate Body Charge 20.1.a.1 Accumulation Charge $V_{FBeff} = V_{fb} - 0.5\left((V_{fb} - V_{gb} - \delta) + \sqrt{(V_{fb} - V_{gb} - \delta)^2 + \delta^2}\right)$ where $V_{gb} = V_{gs} - V_{bseff}$ 20.1.a.2 $V_{fb} = V_{th} - \phi_s - K_{1eff}\sqrt{\phi_s - V_{bseff}} + delvt$ 20.1.a.3 $V_{gsteffCV} = nv_t \ln\left(1 + \exp\left[\dfrac{V_{gs} - V_{th}}{nv_t}\right]\cdot\exp\left[-\dfrac{delvt}{nv_t}\right]\right)$ 20.1.a.4 $Q_{acc} = -F_{body}\left(\dfrac{W_{active}L_{activeB}}{N_{seg}} + A_{gbep}\right)C_{ox}(V_{FBeff} - V_{fb})$ 20.1.a.6 Gate Induced Depletion Charge $Q_{sub0} = -F_{body}\left(\dfrac{W_{active}L_{activeB}}{N_{seg}} + A_{gbep}\right)C_{ox}\dfrac{K_{1eff}^2}{2}\left(-1 + \sqrt{\dfrac{1 + 4(V_{gs} - V_{FBeff} - V_{gsteffCV} - V_{bseff})}{K_{1eff}^2}}\right)$ 20.1.a.7 $V_{dsatCV} = V_{gsteffCV}/A_{bulkCV}$, $A_{bulkCV} = A_{bulk0}\left[1 + \left(\dfrac{CLC}{L_{activeB}}\right)^{CLE}\right]$ -continued 20.1.a.9 $Q_{subs} = F_{body}\left(\dfrac{W_{active}L_{activeB}}{N_{seg}} + A_{gbcp}\right)K_{1eff}C_{ox}(A_{bulkCV} - 1)\left[\dfrac{V_{dsCV}}{2} - \dfrac{A_{bulkCV}V_{dsCV}^2}{12(V_{gsteffCV} - A_{bulkCV}V_{dsCV}/2)}\right]$ 20.1.a.10 Back Gate Body Charge $Q_e = k_{b1}F_{body}\left(\dfrac{W_{active}L_{activeBG}}{N_{seg}} + A_{ebcp}\right)C_{box}(V_{es} - V_{fbb} - V_{bseff})$ 20.1.b Inversion Charge 20.1.b.1 $V_{cveff} = V_{dsat,CV} - 0.5\left(V_4 + \sqrt{V_4^2 + 4\delta_4 V_{dsat,CV}}\right)$ where $V_4 = V_{dsat,CV} - V_{ds} - \delta_4$; $\delta_4 = 0.02$ 20.1.b.2 $Q_{inv} = -\left(\dfrac{W_{active}L_{active}}{N_{seg}} + A_{gbcp}\right)C_{ox}\left(\left(V_{gsteffCV} - \dfrac{A_{bulkCV}}{2}V_{cveff}^2\right) + \dfrac{A_{bulkCV}^2 V_{cveff}^2}{12\left(V_{gsteffCV} - \dfrac{A_{bulkCV}^2}{2}V_{cveff}\right)}\right)$ 20.1.b.3 50/50 Charge Partition $Q_{inv,x} = Q_{inv,d} = 0.5\, Q_{inv}$ 20.1.b.4 40/60 Charge Partition $Q_{inv,x} = -\dfrac{\left(\dfrac{W_{active}L_{active}}{N_{seg}} + A_{gbcp}\right)C_{ox}}{2\left(V_{gsteffCV} - \dfrac{A_{bulkCV}}{2}V_{cveff}\right)^2}\left(V_{gsteffCV}^3 - \dfrac{4}{3}V_{gsteffCV}^2(A_{bulkCV}V_{cveff}) + \dfrac{2}{3}V_{gsteff}(A_{bulkCV}V_{cveff})^2 - \dfrac{2}{15}(A_{bulkCV}V_{cveff})^3\right)$ $Q_{inv,d} = -\dfrac{\left(\dfrac{W_{active}L_{active}}{N_{seg}} + A_{gbcp}\right)C_{ox}}{2\left(V_{gsteffCV} - \dfrac{A_{bulkCV}}{2}V_{cveff}\right)^2}\left(V_{gsteffCV}^3 - \dfrac{5}{3}V_{gsteffCV}^2(A_{bulkCV}V_{cveff}) + V_{gsteff}(A_{bulkCV}V_{cveff})^2 - \dfrac{1}{5}(A_{bulkCV}V_{cveff})^3\right)$ 20.1.b.6 0/100 Charge Partition $Q_{inv,x} = -\dfrac{W_{active}L_{active} + A_{gbcp}}{N_{seg}}C_{ox}\left(\dfrac{V_{gsteff}}{2} + \dfrac{A_{bulkCV}V_{cveff}}{4} - \dfrac{(A_{bulkCV}V_{cveff})^2}{24\left(V_{gsteffCV} - \dfrac{A_{bulkCV}}{2}V_{cveff}\right)}\right)$ 20.1.b.7 $Q_{inv,d} = -\dfrac{W_{active}L_{active} + A_{gbcp}}{N_{seg}}C_{ox}\left(\dfrac{V_{gsteff}}{2} + \dfrac{3A_{bulkCV}V_{cveff}}{4} + \dfrac{(A_{bulkCV}V_{cveff})^2}{8\left(V_{gsteffCV} - \dfrac{A_{bulkCV}}{2}V_{cveff}\right)}\right)$ 20.2 (2)capMod = 3(Charge-Thickness Model)

capMod = 3 only supports zero-bias flat band voltage, which is calculated from bias-independent threshold voltage.

This is different from capMod = 2. For the finite thickness ($X_{DC}$) formulation refer to Chapter 4 of BSIM3v3.2 Users's Manual.

20.2.a Front Gate Body Charge 20.2.a.1 Accumulation Charge $V_{FBeff} = V_{fb} - 0.5\left((V_{fb} - V_{gb} - \delta) + \sqrt{(V_{fb} - V_{gb} - \delta)^2 + \delta^2}\right)$ where $V_{gb} = V_{gs} - V_{bseff}$ 20.2.a.2 $V_{fb} = V_{th} - \phi_s - K_{1eff}\sqrt{\phi_s - V_{bseff}}$ 20.2.a.3 $Q_{acc} = -F_{body}\left(\dfrac{W_{active}L_{activeB}}{N_{seg}} + A_{gbcp}\right)C_{axteff}V_{gbace}$ 20.2.a.4 $V_{gbace} = 0.5\left(V_0 + \sqrt{V_0^2 + 4\delta V_{fb}}\right)$ 20.2.a.5 $V_0 = V_{fb} + V_{bseff} - V_{gs} - \delta$ 20.2.a.6 $C_{oxeff} = \dfrac{C_{ox}C_{cen}}{C_{ox} + C_{cen}}$ 20.2.a.7 $C_{cen} = \varepsilon_{Si}/X_{DC}$ 20.2.a.8 Gate Induced Depletion Charge $Q_{sub0} = -F_{body}\left(\dfrac{W_{active}L_{activeB}}{N_{seg}} + A_{gbcp}\right)C_{axteff}\dfrac{K_{1eff}^2}{2}\left(-1 + \sqrt{1 + \dfrac{4(V_{gs} - V_{FBeff} - V_{gsteffCV} - V_{bseff})}{K_{1eff}^2}}\right.$ -continued 20.2.a.9 Drain Induced Depletion Charge $V_{dsatCV} = (V_{gsteffCV} - \Phi_\delta)/A_{bulkCV}$ 20.2.a.10 $\Phi_\delta = \Phi_s = 2\Phi_B = v_t \ln\left[1 + \dfrac{V_{gsteffCV}(V_{gsteffCV} + 2K_{1eff}\sqrt{2\Phi_B})}{moinK_{1eff}v_t^2}\right]$ 20.2.a.11 $v_{dsCV} = v_{dsatCV} - \dfrac{1}{2}\left\{V_{dsatCV} - v_{ds} - \delta + \sqrt{(v_{dsatCV} - v_{ds} - \delta)^2 + 4\delta V_{dsatCV}}\right)$ 20.2.a.12 $Q_{subs} = F_{body}\left(\dfrac{W_{active}L_{activeB}}{N_{seg}} + A_{gbcp}\right)K_{1eff}C_{axeff}(A_{bulkCV} - 1)\left[\dfrac{V_{dsCV}}{2} - \dfrac{A_{bulkCV}V_{dsCV}^2}{12(V_{gsteffCV} - \Phi_\delta - A_{bulkCV}V_{dsCV}/2)}\right.$ 20.2.a.13 Back Gate Body Charge $Q_e = k_{b1}F_{body}\left(\dfrac{W_{active}L_{activeBG}}{N_{seg}} + A_{ebcp}\right)C_{box}(V_{es} - V_{fbb} - V_{bseff})$ 20.2.b Inversion Charge 20.2.b.1 $V_{cveff} = V_{dsat,CV} - 0.5\left(V_4 + \sqrt{V_4^2 + 4\delta_4 V_{dsat,CV}}\right)$ where $V_4 V_{dsat,CV} - V_{ds} - \delta_4$; $\delta_4 = 0.02$ 20.2.b.2 $Q_{inv} = -\left(\dfrac{W_{active}L_{active}}{N_{seg}} + A_{gbcp}\right)C_{axeff}\left(\left(V_{gsteffCV} - \Phi_\delta - \dfrac{A_{bulkCV}}{2}V_{cveff}\right) + \dfrac{A_{bulkCV}^2 V_{cveff}^2}{12\left(V_{gsteffCV} - \Phi_\delta - \dfrac{A_{bulkCV}^2}{2}V_{cveff}\right)}\right)$ 20.2.b.3 50/50 Charge Partition $Q_{inv,s} = Q_{inv,d} = 0.5 Q_{inv}$ 20.2.b.4 40/60 Charge Partition $Q_{inv,s} = -\dfrac{\left(\dfrac{W_{active}L_{active}}{N_{seg}} + A_{gbcp}\right)C_{axeff}}{2\left(V_{gsteffCV} - \Phi_\delta - \dfrac{A_{bulkCV}}{2}V_{cveff}\right)^2}$ $\left\{(V_{gsteffCV} - \Phi_\delta)^3 - \dfrac{4}{3}(V_{gsteffCV} - \Phi_\delta)^2(A_{bulkCV}V_{cveff}) + \dfrac{2}{3}(V_{gsteff} - \Phi_\delta)(A_{bulkCV}V_{cveff})^2 - \dfrac{2}{15}A_{bulkCV}V\right.$ 20.2.b.5

$Q_{inv,d} = -\dfrac{\left(\dfrac{W_{active}L_{active}}{N_{seg}} + A_{gbcp}\right)C_{axeff}}{2\left(V_{gsteffCV} - \Phi_\delta - \dfrac{A_{bulkCV}}{2}V_{cveff}\right)^2}$ $\left\{(V_{gsteffCV} - \Phi_\delta)^3 - \dfrac{5}{3}(V_{gsteffCV} - \Phi_\delta)^2(A_{bulkCV}V_{cveff}) + (V_{gsteff} - \Phi_\delta)(A_{bulkCV}V_{cveff})^2 - \dfrac{1}{5}A_{bulkCV}V\right.$ -continued 20.2.b.6 0/100 Charge Partition $$Q_{inv,s} = \frac{W_{active}L_{active} + A_{gbcp}}{N_{seg}} C_{oxeff}\left(\frac{V_{gsteffCV} - \Phi_\delta}{2} + \frac{A_{bulkCV}V_{cveff}}{4} - \frac{(A_{bulkCV}V_{cveff})^2}{24\left(V_{gsteffCV} - \Phi_\delta - \frac{A_{bulkCV}}{2}V_{cveff}\right)}\right)$$

20.2.b.7 $Q_{inv,d} = \frac{W_{active}L_{active} + A_{gbcp}}{N_{seg}} C_{oxeff}\left(\frac{V_{gsteffCV} - \Phi_\delta}{2} + \frac{3A_{bulkCV}V_{cveff}}{4} + \frac{(A_{bulkCV}V_{cveff})^2}{8\left(V_{gsteffCV} - \Phi_\delta - \frac{A_{bulkCV}}{2}V_{cveff}\right)}\right)$ 21 Overlap Capacitance 21.1 Source Overlap Charge 21.1a $V_{gs\_overlap} = \frac{1}{2}\left\{(V_{gs} + \delta) + \sqrt{(V_{gs} + \delta)^2 + 4\delta}\right\}$ 21.1b $\frac{Q_{overlap,s}}{W_{diosCV}} CGS0 \cdot V_{gs} + CGS1\left\{V_{gs} - V_{gs\_overlap} + \frac{CKAPPA}{2}\left(-1 + \sqrt{1 + \frac{4V_{gs\_overlap}}{CKAPPA}}\right)\right\}$ 21.2 Drain Overlap Charge 21.2a $V_{gd\_overlap} = \frac{1}{2}\left\{(v_{gd} + \delta)\sqrt{(v_{gd} + \delta)^2 + 4\delta}\right\}$ 21.2b $\frac{Q_{overlap,d}}{W_{diodCV}} =$ $$CGD0 \cdot V_{gd} + CGD1\left\{V_{gd} - V_{gd\_overlap} + \frac{CKAPPA}{2}\left(-1 + \sqrt{1 + \frac{4V_{gd\_overlap}}{CKAPPA}}\right)\right\}$$

21.3 Gate Overlap Charge 21.3.a $Q_{overlap,g} = -(Q_{overlap,s} + Q_{overlap,d})$ 21.4 Source/Drain Junction Charge For $V_{bs} < 0.95\phi_s$ 21.4.a.1 $Q_{jswg} = Q_{bsdep} + Q_{bsdif}$ else 21.4.a.2 $Q_{jswg} = C_{bsdep}\left(0.95\phi_s(V_{bs} - 0.95\phi_s) + Q_{bsdif}\right.$ For $V_{bd} < 0.95\phi_s$ 21.4.a.3 $Q_{jdwg} = Q_{bddep} + Q_{bddif}$ else 21.4.a.4 $Q_{jdwg} = C_{bddep}(0.95\phi_s)(V_{bd} - 0.95\phi_s) + Q_{bddif}$ where 21.4.b.1 $Q_{bsdep} = W_{diosCV} C_{jswg} \frac{T_{si}}{10^{-7}} \frac{P_{bswg}}{1 - Mj_{swg}}\left[1 - \left(1 - \frac{V_{bs}}{P_{bswg}}\right)^{1 - M_{jswg}}\right]$ 21.4.b.2 $Q_{bddep} = W_{diodCV} C_{jswg} \frac{T_{si}}{10^{-7}} \frac{P_{bswg}}{1 - Mj_{swg}}\left[1 - \left(1 - \frac{V_{bd}}{P_{bswg}}\right)^{1 - M_{jswg}}\right]$ 21.4.b.3 $Q_{bsdif} = \frac{W'_{eff}}{N_{seg}} T_{si} J_{sbjt}\left[1 + L_{dif0}\left(L_{bj0}\left(\frac{1}{L_{eff}} + \frac{1}{L_n}\right)^{N_{dif}}\right)\right]\left[\exp\left(\frac{V_{bs}}{n_{dio}V_t}\right) - 1\right]\frac{1}{\sqrt{E_{blis} + 1}}$ 21.4.b.4 $Q_{bddif} = \frac{W'_{eff}}{N_{seg}} T_{si} J_{sbjt}\left[1 + L_{dif0}\left(L_{bj0}\left(\frac{1}{L_{eff}} + \frac{1}{L_n}\right)^{N_{dif}}\right)\right]\left[\exp\left(\frac{V_{bd}}{n_{dio}V_t}\right) - 1\right]\frac{1}{\sqrt{E_{blid} + 1}}$ -continued 21.4.b.5 $C_{jswg} = C_{jswg0}[1 + t_{cjswg}(T - T_{nom})]$ 21.4.b.6 $P_{bswg} = P_{bswg0} - t_{pbswg}(T - T_{nom})$ 22 Extrinsic Capacitance 22.1 Bottom S/D to Substrate Capacitance $$C_{sld,e} = \begin{cases} C_{box} & \text{if} \quad V_{sld,e} < V_{sdfb} \\ C_{box} - \frac{1}{A}(C_{box} - C_{min})\left(\frac{V_{sld,e} - V_{sdfb}}{V_{sdth} - V_{sdfb}}\right)^2 & \text{elseif} \quad V_{sld,e} < V_{sdfb} + A_{sd}(V_{sdth} - V_{sdfb}) \\ C_{min} + \frac{1}{1 - A_{sd}}(C_{box} - C_{min})\left(\frac{V_{sld,e} - V_{sdfb}}{V_{sdth} - V_{sdfb}}\right)^2 & \text{elseif} \quad V_{sld,e} < V_{sdth} \\ C_{min} & \text{else} \end{cases}$$

22.2 Sidewall S/D to Substrate Capacitance $$C_{sld,esw} = C_{sdesw}\log\left(1 + \frac{T_{si}}{T_{box}}\right)$$

What is claimed is:

1. A computer-implemented method for modeling devices having different geometries in an integrated circuit using a device model, comprising:
    dividing a geometrical space including the different geometries into a first set of subregions and a second set of subregions, the first or the second set of subregions including one or more subregions, wherein each of the second set of subregions includes at least some portion that is not included in the first set of subregions;
    extracting a set of model parameters for each of the first set of subregions using model equations associated with the device model and measurement data obtained from a plurality of test devices;
    determining binning parameters for each of the second set of subregions using one or more model parameters associated with one or more subregions in the first set of subregions; and
    saving at least some of the model parameters or the binning parameters in one or more files.

2. The method of claim 1, wherein each of the first set of subregions is bordered by one of the second set of subregions.

3. The method of claim 1, wherein each of the first or second set of subregions covers a subrange of device geometry variations within the geometrical space.

4. The method of claim 1, wherein the measurement data include measured values of a set of physical quantities associated with the test devices and extracting a set of model parameters for each of the first set of subregions comprises:
    calculating values of the set of physical quantities associated with the devices using model equations and an initial guess of the values of the set of model parameters; and
    adjusting the values of the set of model parameters by fitting the calculated values of the set of physical quantities with the measurement data.

5. The method of claim 1, wherein the measurement data used to extract model parameters for a subregion include current and capacitance data measured from the plurality of test devices.

6. The method of claim 5, wherein the plurality of test devices include test devices whose geometries are within or on borders of the subregion.

7. The method of claim 1, wherein determining binning parameters for each of the second set of subregions comprises:
    selecting a model parameter for binning;
    determining boundary values of the selected model parameter; and
    solving for the binning parameters associated with the selected model parameter using the boundary values.

8. The method of claim 7, wherein the boundary values of the selected model parameter are determined based on one or more extracted parameters in one or more subregions in the first set of subregions.

9. The method of claim 8, wherein the one or more subregions in the first set of subregions are adjacent the subregion for which binning parameters are determined.

10. The method of claim 7, wherein solving for the one or more binning parameters comprises expressing the selected model parameter as a function of device geometry instances in the subregion, the function including the one or more binning parameters associated with the selected model parameter as coefficients.

11. A computer readable storage medium comprising computer executable program instructions that when executed cause a digital processing system to perform a method for modeling devices having different geometries in an integrated circuit, the method comprising:
    dividing a geometrical space including the different geometries into a first set of subregions and a second set of subregions, the first or the second set of subregions including one or more subregions, wherein each of the second set of subregions includes at least some portion that is not included in the first set of subregions;
    extracting a set of model parameters for each of the first set of subregions using model equations associated with a device model and measurement data obtained from a plurality of test devices;
    determining binning parameters for each of the second set of subregions using one or more model parameters associated with one or more subregions in the first set of subregions; and
    saving at least some of the model parameters or the binning parameters in one or more files.

12. The computer readable storage medium of claim 11, wherein each of the first set of subregions is bordered by one of the second set of subregions.

13. The computer readable storage medium of claim 11, wherein each of the first or second set of subregions covers a subrange of device geometry variations within the geometrical space.

14. The computer readable storage medium of claim 11, wherein the measurement data include measured values of a set of physical quantities associated with the test devices and extracting a set of model parameters for each of the first set of subregions comprises:
 calculating values of the set of physical quantities associated with the devids using model equations and an initial guess of the values of the set of model parameters; and
 adjusting the values of the set of model parameters by fitting the calculated values of the set of physical quantities with the measurement data.

15. The computer readable storage medium of claim 11, wherein the measurement data used to extract model parameters for a subregion include current and capacitance data measured from the plurality of test devices.

16. The computer readable storage medium of claim 15, wherein the plurality of test devices include test devices whose geometries are within or on borders of the subregion.

17. The computer readable storage medium of claim 11, wherein determining binning parameters for each of the second set of subregions comprises:
 selecting a model parameter for binning;
 determining boundary values of the selected model parameter; and
 solving for the binning parameters associated with the selected model parameter using the boundary values.

18. The computer readable storage medium of claim 17, wherein the boundary values of the selected model parameter are determined based on one or more extracted parameters in one or more subregions in the first set of subregions.

19. The computer readable storage medium of claim 18, wherein the one or more subregions in the first set of subregions are adjacent the subregion for which binning parameters are determined.

20. The computer readable storage medium of claim 17, wherein solving for the one or more binning parameters compnses expressing the selected model parameter as a function of device geometry instances in the subregion, the function including the one or more binning parameters associated with the selected model parameter as coefficients.

21. A digital processing system for modeling devices having different geometries in an integrated circuit, comprising:
 a central processing unit (CPU);
 a memory device coupled to the central processing unit and storing therein computer executable program instructions that when executed by the CPU cause the digital processing system to perform a method for modeling devices having different geometries in an integrated circuit, the method comprising:
 dividing a geometrical space including different geometries into a first set of subregions and a second set of subregions, the first or the second set of subregions including one or more subregions, wherein each of the second set of subregions includes at least some portion that is not included in the first set of subregions;
 extracting a set of model parameters for each of the first set of subregions using model equations associated with a device model and measurement data obtained from a plurality of test devices;
 determining binning parameters for each of the second set of subregions using one or more model parameters associated with one or more subregions in the first set of subregions; and
 saving at least some of the model parameters or the binning parameters in one or more files.

22. The digital processing system of claim 21, further comprising an input port for inputting the measurement data from the plurality of test devices.

* * * * *